(12) United States Patent
Lien et al.

(10) Patent No.: US 11,386,968 B1
(45) Date of Patent: Jul. 12, 2022

(54) MEMORY APPARATUS AND METHOD OF OPERATION USING PLANE DEPENDENT RAMP RATE AND TIMING CONTROL FOR PROGRAM OPERATION

(71) Applicant: SanDisk Technologies LLC, Addison, TX (US)

(72) Inventors: Yu-Chung Lien, San Jose, CA (US); Huai-yuan Tseng, San Ramon, CA (US); Tomer Eliash, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/149,136

(22) Filed: Jan. 14, 2021

(51) Int. Cl.
| | |
|---|---|
| G11C 16/04 | (2006.01) |
| G11C 16/10 | (2006.01) |
| G11C 16/34 | (2006.01) |
| G11C 16/12 | (2006.01) |
| G11C 16/06 | (2006.01) |
| G11C 16/08 | (2006.01) |
| G11C 16/30 | (2006.01) |
| G11C 16/26 | (2006.01) |
| G11C 16/24 | (2006.01) |

(52) U.S. Cl.
CPC .......... *G11C 16/3454* (2013.01); *G11C 16/08* (2013.01); *G11C 16/10* (2013.01); *G11C 16/24* (2013.01); *G11C 16/26* (2013.01); *G11C 16/30* (2013.01)

(58) Field of Classification Search
CPC ..... G11C 16/3454; G11C 16/08; G11C 16/10; G11C 16/24; G11C 16/26; G11C 16/30
USPC .................................................... 365/185.22
See application file for complete search history.

(56) References Cited

U.S. PATENT DOCUMENTS

| | | | |
|---|---|---|---|
| 8,644,075 B2 | 2/2014 | Hemink et al. | |
| 8,854,890 B1 | 10/2014 | Miwa | |
| 9,406,391 B1 | 8/2016 | Chen et al. | |
| 9,466,369 B1 | 10/2016 | Pang et al. | |
| 10,026,487 B2 | 7/2018 | Chen et al. | |
| 10,366,739 B2 | 7/2019 | Amarnath et al. | |
| 10,468,111 B1 | 11/2019 | Yang et al. | |
| 10,566,059 B2 | 2/2020 | Diep et al. | |
| 10,636,500 B1 * | 4/2020 | Chen | G11C 16/3427 |
| 2002/0051383 A1 * | 5/2002 | Mangan | G11C 29/50012 |
| | | | 365/185.11 |
| 2010/0165738 A1 * | 7/2010 | Cernea | G11C 16/26 |
| | | | 365/185.21 |

(Continued)

*Primary Examiner* — Ly D Pham
(74) *Attorney, Agent, or Firm* — Dickinson Wright PLLC; Steven C. Hurles

(57) ABSTRACT

A memory apparatus and method of operation is provided. The apparatus includes memory cells connected to word lines and bit lines and arranged in a plurality of planes. The apparatus also includes a control circuit coupled to the word lines and the bit lines and configured to determine whether a program operation of the memory cells involves all of the plurality of planes. In response to the program operation of the memory cells not involving all of the plurality of planes, the control circuit adjusts at least one of a bit line ramp rate of a bit line voltage applied to the bit lines and a word line ramp rate of at least one word line voltage applied to the word lines during the program operation based on a quantity of the plurality of planes associated with the memory cells being program-verified in the program operation.

20 Claims, 20 Drawing Sheets

(56) References Cited

U.S. PATENT DOCUMENTS

2016/0293264 A1* 10/2016 Al-Shamma ........... G11C 16/24
2020/0335168 A1   10/2020 Lu et al.
2021/0375371 A1* 12/2021 Lien ..................... G11C 16/30

* cited by examiner

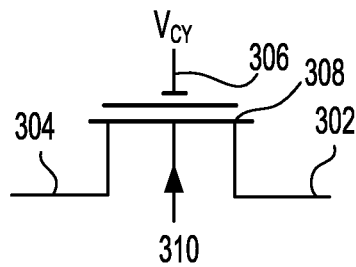
FIG. 3
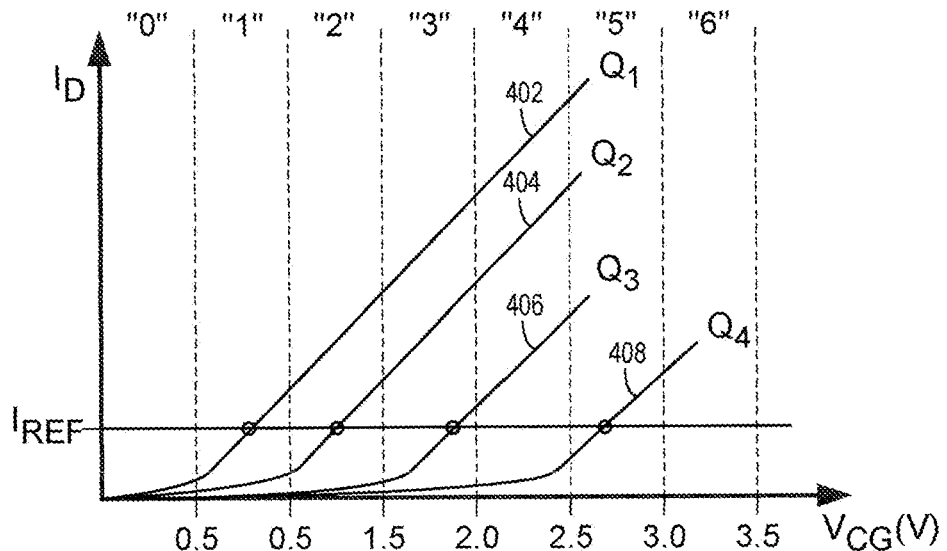
FIG. 4
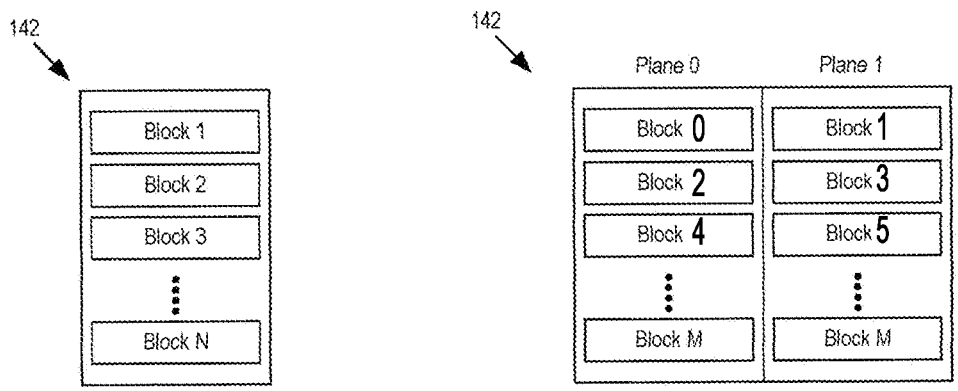
FIG. 5A     FIG. 5B

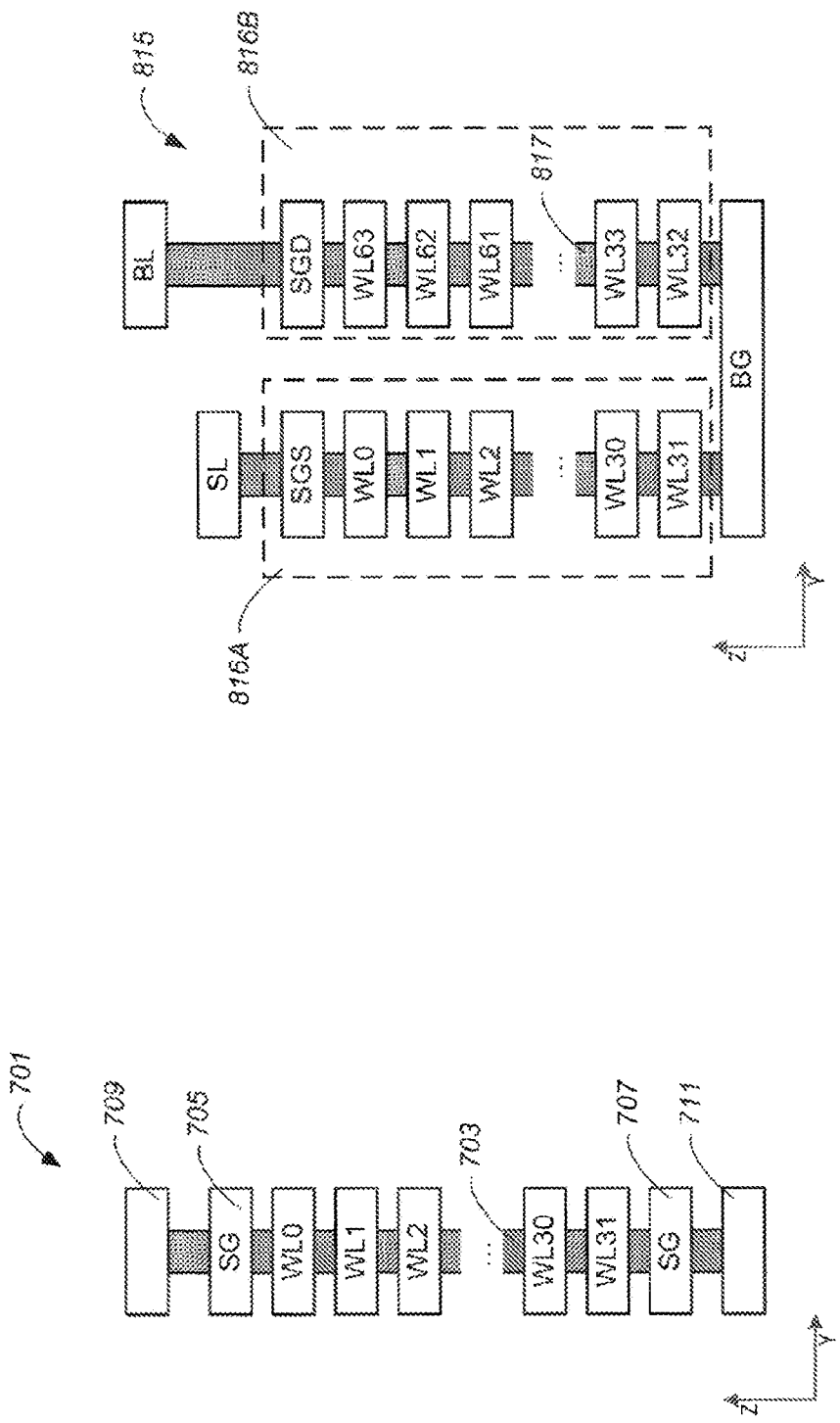

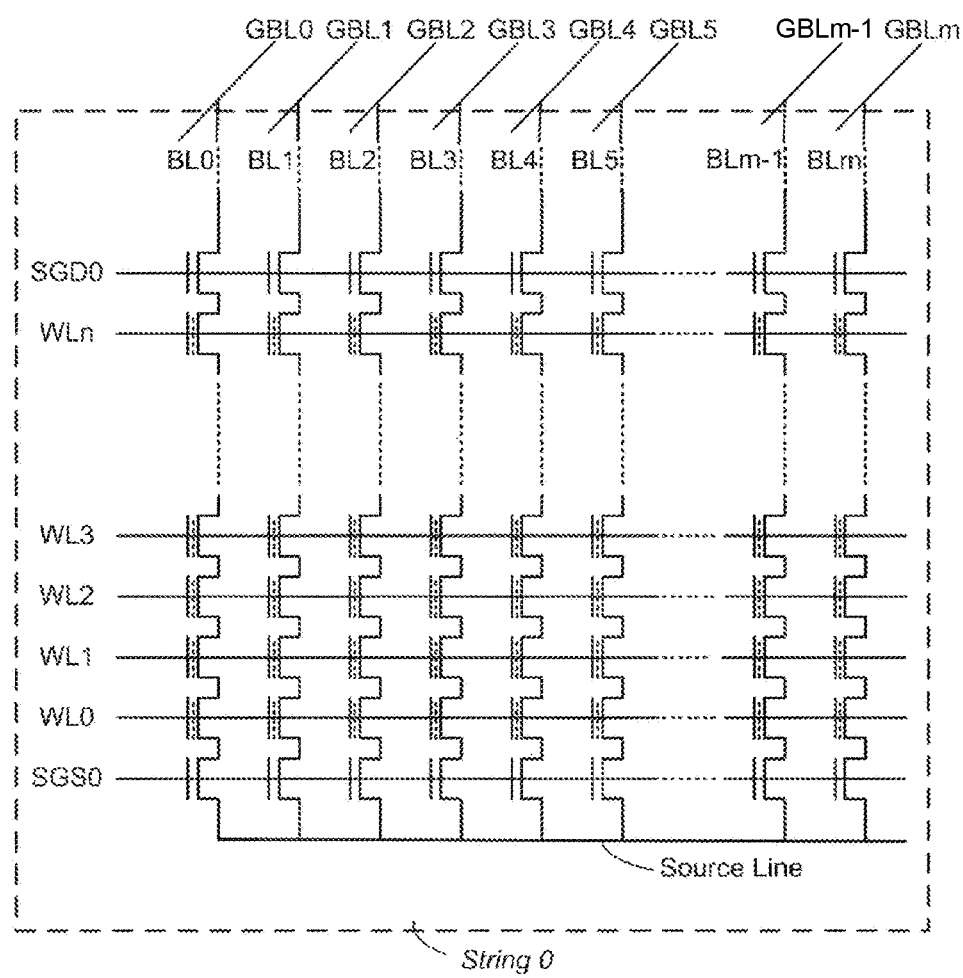
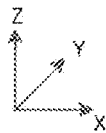
FIG. 10C

FIG. 15A

IBLRR_P

| ADD=XXH | | | | | | | | CURRENT (a.u.) |
|---|---|---|---|---|---|---|---|---|
| [7] | [6] | [5] | [4] | [3] | [2] | [1] | [0] HEX 1T | |
| | | 0 | 0 | | | | 0H | B1 |
| | | 0 | 0 | | | | 1H | B2 |
| | | 0 | 1 | | | | 2H | B3 |
| | | 0 | 1 | | | | 3H | B4 |
| | | 1 | 0 | | | | 4H | B5 |
| | | 1 | 0 | | | | 5H | B6 |
| | | 1 | 1 | | | | 6H | B7 |
| | | 1 | 1 | | | | 7H | B8 |

*CURRENT PER 16KB

FIG. 15B

DIBLRR_P_PB

| ADD=XXH | | | | | | | | OPTIONS |
|---|---|---|---|---|---|---|---|---|
| [7] | [6] | [5] | [4] | [3] | [2] | [1] | [0] HEX 1T | |
| | | 0 | 0 | | | | 0H | DISABLE |
| | | 0 | 1 | | | | 1H | +1 DAC |
| | | 1 | 0 | | | | 2H | +2 DAC |
| | | 1 | 1 | | | | 3H | +3 DAC |

ADD=XXH

F RRC VPASS

| [7] | [6] | [5] | [4] | [3] | [2] | [1] | [0] | HEX | 1T | RATE: DRRC VPASS PB= DISABLE | RATE: DRRC VPASS PB= -1DAC (3P) |
|---|---|---|---|---|---|---|---|---|---|---|---|
| | | | | | | | | | | Y1 | Y4 |
| | | | | | | | | | | Y2 | Y5 |
| | | | | | | | | | | Y3 | Y6 |
| | | | | | | | | | | RRC DISABLE | RRC DISABLE |

FIG. 17A

ADD=XXH

F DRRC VPASS PB

| [7] | [6] | [5] | [4] | [3] | [2] | [1] | [0] | HEX | 1T | OPTIONS |
|---|---|---|---|---|---|---|---|---|---|---|
| | | 0 | 0 | | | | | 0H | | DISABLE |
| | | 0 | 1 | | | | | 1H | | -1 DAC |
| | | 1 | 0 | | | | | 2H | | -2 DAC |
| | | 1 | 1 | | | | | 3H | | -3 DAC |

ADD=XXH

F RRC VREAD PVFY

| [7] | [6] | [5] | [4] | [3] | [2] | [1] | [0] | HEX | 1T | RATE[X]: DRRC VREAD PVFY PB= DISABLE | RATE[X]: DRRC VREAD PB= -1DAC (3P) |
|---|---|---|---|---|---|---|---|---|---|---|---|
| | 0 | 0 | 0 | | | | | 0H | | DISABLE | DISABLE |
| | 0 | 0 | 1 | | | | | 1H | | Z1 | DISABLE |
| | 0 | 1 | 0 | | | | | 2H | | Z2 | Z8 |
| | 0 | 1 | 1 | | | | | 3H | | Z3 | Z9 |
| | 1 | 0 | 0 | | | | | 4H | | Z4 | Z10 |
| | 1 | 0 | 1 | | | | | 5H | | Z5 | Z11 |
| | 1 | 1 | 0 | | | | | 6H | | Z6 | Z12 |
| | 1 | 1 | 1 | | | | | 7H | | Z7 | Z13 |

FIG. 18B

ADD=XXH

F DRRC VREAD PVFY PB

| [7] | [6] | [5] | [4] | [3] | [2] | [1] | [0] | HEX | 1T | OPTIONS |
|---|---|---|---|---|---|---|---|---|---|---|
| | | 0 | 0 | | | | | 0H | | DISABLE |
| | | 0 | 1 | | | | | 1H | | -1 DAC |
| | | 1 | 0 | | | | | 2H | | -2 DAC |
| | | 1 | 1 | | | | | 3H | | -3 DAC |

ADD=XXH

| [7] | [6] | [5] | [4] | [3] | [2] | [1] | [0] | # # | TIME[us] | DP13_PB=DISABLE | DP13_PB=-1DAC(3P) |
|---|---|---|---|---|---|---|---|---|---|---|---|
| | | | 0 | | | 0 | 0 | X | | T1 | T9 |
| | | | 0 | | | 0 | 1 | X | | T2 | T10 |
| | | | 0 | | | 1 | 0 | | | T3 | T11 |
| | | | 0 | | | 1 | 1 | | | T4 | T12 |
| | | | 1 | | | 0 | 0 | | | T5 | T13 |
| | | | 1 | | | 0 | 1 | | | T6 | T14 |
| | | | 1 | | | 1 | 0 | | | T7 | T15 |
| | | | 1 | | | 1 | 1 | | | T8 | T16 |

ADD=XXH

| [7] | [6] | [5] | [4] | [3] | [2] | [1] | [0] | HEX 1T | OPTIONS |
|---|---|---|---|---|---|---|---|---|---|
| | | 0 | 0 | | | | | 0H | DISABLE |
| | | 0 | 1 | | | | | 1H | -1 DAC |
| | | 1 | 0 | | | | | 2H | -2 DAC |
| | | 1 | 1 | | | | | 3H | -3 DAC |

FIG. 20A

F_R2_PVFY

ADD=08BH

| [7] | [6] | [5] | [4] | [3] | [2] | [1] | [0] | # # | TIME[us] | DR2_PVFY_PB=DISABLE | DR2_PVFY_PB=-1DAC(3P) |
|---|---|---|---|---|---|---|---|---|---|---|---|
| | | | 0 | | | 0 | 0 | X | | T17 | T25 |
| | | | 0 | | | 0 | 1 | X | | T18 | T26 |
| | | | 0 | | | 1 | 0 | | | T19 | T27 |
| | | | 0 | | | 1 | 1 | | | T20 | T28 |
| | | | 1 | | | 0 | 0 | | | T21 | T29 |
| | | | 1 | | | 0 | 1 | | | T22 | T30 |
| | | | 1 | | | 1 | 0 | | | T23 | T31 |
| | | | 1 | | | 1 | 1 | | | T24 | T32 |

FIG. 20B

F_DR2_PVFY_PB

ADD=XXH

| [7] | [6] | [5] | [4] | [3] | [2] | [1] | [0] | HEX 1T | OPTIONS |
|---|---|---|---|---|---|---|---|---|---|
| | | 0 | 0 | | | | | 0H | DISABLE |
| | | 0 | 1 | | | | | 1H | -1 DAC |
| | | 1 | 0 | | | | | 2H | -2 DAC |
| | | 1 | 1 | | | | | 3H | -3 DAC |

MEMORY APPARATUS AND METHOD OF OPERATION USING PLANE DEPENDENT RAMP RATE AND TIMING CONTROL FOR PROGRAM OPERATION

FIELD

This application relates to non-volatile memory apparatuses and the operation of non-volatile memory apparatuses.

BACKGROUND

This section provides background information related to the technology associated with the present disclosure and, as such, is not necessarily prior art.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices. For example, various voltages are applied to the bit lines and word lines at specific times during a program operation. The rate at which these voltages are applied can affect a current consumption of the memory device, as well as the speed of the programming operation.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a plurality of memory cells connected to word lines and bit lines and arranged in a plurality of planes. The apparatus also includes a control circuit coupled to the word lines and the bit lines and configured to determine whether a program operation of the plurality of memory cells involves all of the plurality of planes. In response to the program operation of the plurality of memory cells not involving all of the plurality of planes, the control circuit is configured to adjust at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation.

According to another aspect of the disclosure, a controller in communication with a memory apparatus including a plurality of memory cells connected to word lines and bit lines and arranged in a plurality of planes is provided. The controller is configured to determine whether a program operation of the plurality of memory cells involves all of the plurality of planes. In response to the program operation of the plurality of memory cells not involving all of the plurality of planes, the controller instructs the memory apparatus to adjust at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation.

According to an additional aspect of the disclosure, a method of operating a memory apparatus is provided. The memory apparatus includes a plurality of memory cells connected to word lines and bit lines and arranged in a plurality of planes. The method includes the step of determining whether a program operation of the plurality of memory cells involves all of the plurality of planes. The next step of the method is adjusting at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation in response to the program operation of the plurality of memory cells not involving all of the plurality of planes.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is a circuit diagram of an example floating gate transistor according to aspects of the disclosure;

FIG. 4 is a graph of curves of drain-to-source current as a function of control gate voltage drawn through a floating gate transistor according to aspects of the disclosure;

FIG. 5A is a block diagram of a plurality of memory cells organized into blocks according to aspects of the disclosure;

FIG. 5B is a block diagram of a plurality of memory cells organized into blocks in different planes according to aspects of the disclosure;

FIG. 7 is an example physical structure of a three-dimensional (3-D) NAND string according to aspects of the disclosure;

FIG. 8 is an example physical structure of a U-shaped 3-D NAND string according to aspects of the disclosure;

FIG. 10C is a circuit diagram of a separately selectable set of NAND strings in cross section along the x-z plane according to aspects of the disclosure;

FIGS. 15A and 15B show an example default bit line voltage ramp rate lookup table and an example shifted bit line voltage ramp rate lookup table used for adjusting the bit line voltage ramp rate parameter or bit line ramp rate of the bit line voltage applied to the bit lines according to aspects of the disclosure;

FIGS. 17A and 17B show an example default pass voltage ramp rate lookup table and an example shifted pass voltage ramp rate lookup table according to aspects of the disclosure;

FIGS. 18A and 18B show an example default read voltage ramp rate lookup table and an example shifted read voltage ramp rate lookup table according to aspects of the disclosure;

FIGS. 19A and 19B show an example default pass voltage ramping time period lookup table and an example shifted pass voltage ramping time period lookup table according to aspects of the disclosure;

FIGS. 20A and 20B show an example default read voltage ramping time period lookup table and an example shifted read voltage ramping time period lookup table according to aspects of the disclosure;

DETAILED DESCRIPTION

Figure 1A:
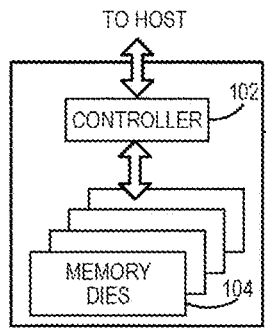
FIG. 1A is a block diagram of an exemplary non-volatile memory system according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Each memory cell may be associated with a data state according to write data in a program command. Based on its data state, a memory cell will either remain in the erased state or be programmed to a programmed data state. For example, in a one bit per cell memory device or apparatus, there are two data states including the erased state and the programmed state. In a two-bit per cell memory device, there are four data states including the erased state and three higher data states referred to as the A, B and C data states (see FIG. 11A). In a three-bit per cell memory device, there are eight data states including the erased state and seven higher data states referred to as the A, B, C, D, E, F and G data states (see FIG. 11B). In a four-bit per cell memory device, there are sixteen data states including the erased state and fifteen higher data states (see FIG. 11C).

Various phases of programming the memory apparatus can require variable amounts of current resulting in a total amount of current consumed by the apparatus during the program operation. For example, during programming, various voltages are applied to the bit lines and word lines at specific times. The rate at which these voltages are applied can affect the current consumption as well as the speed of the programming operation. Yet, hosts or devices using the memory apparatus or device may have current consumption limitations that restrict how the various voltages are applied to the bit lines and word lines.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure it is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s) 104, even if a single channel is shown in the drawings.

Figure 1B:
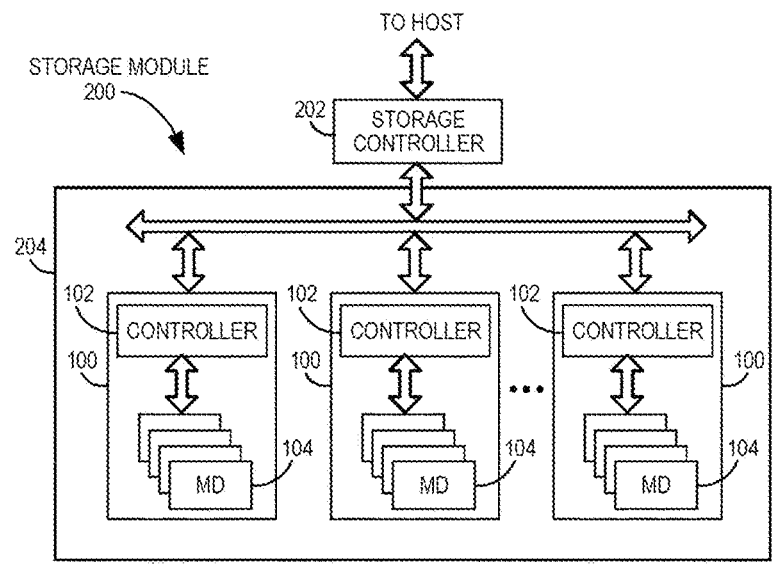
FIG. 1B is a block diagram of a storage module that includes a plurality of non-volatile memory systems according to aspects of the disclosure.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
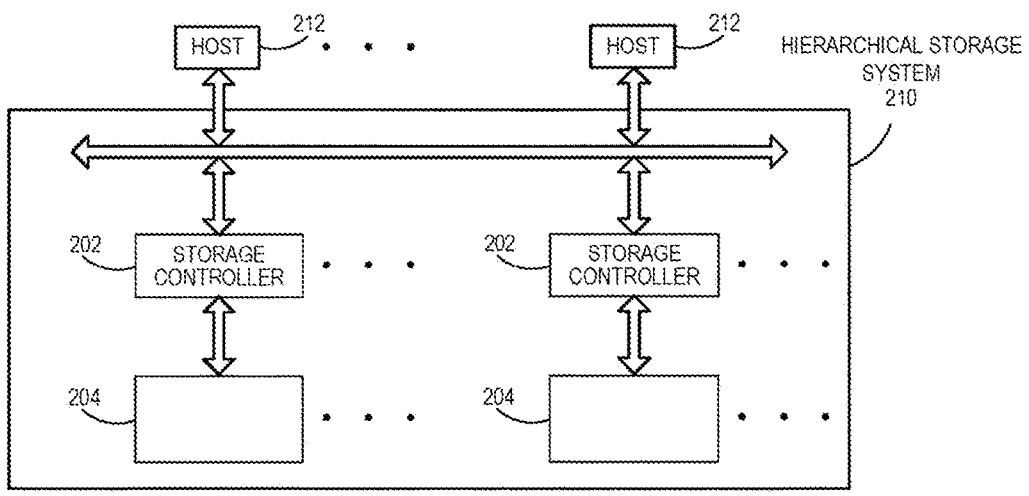
FIG. 1C is a block diagram of a hierarchical storage system according to aspects of the disclosure.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
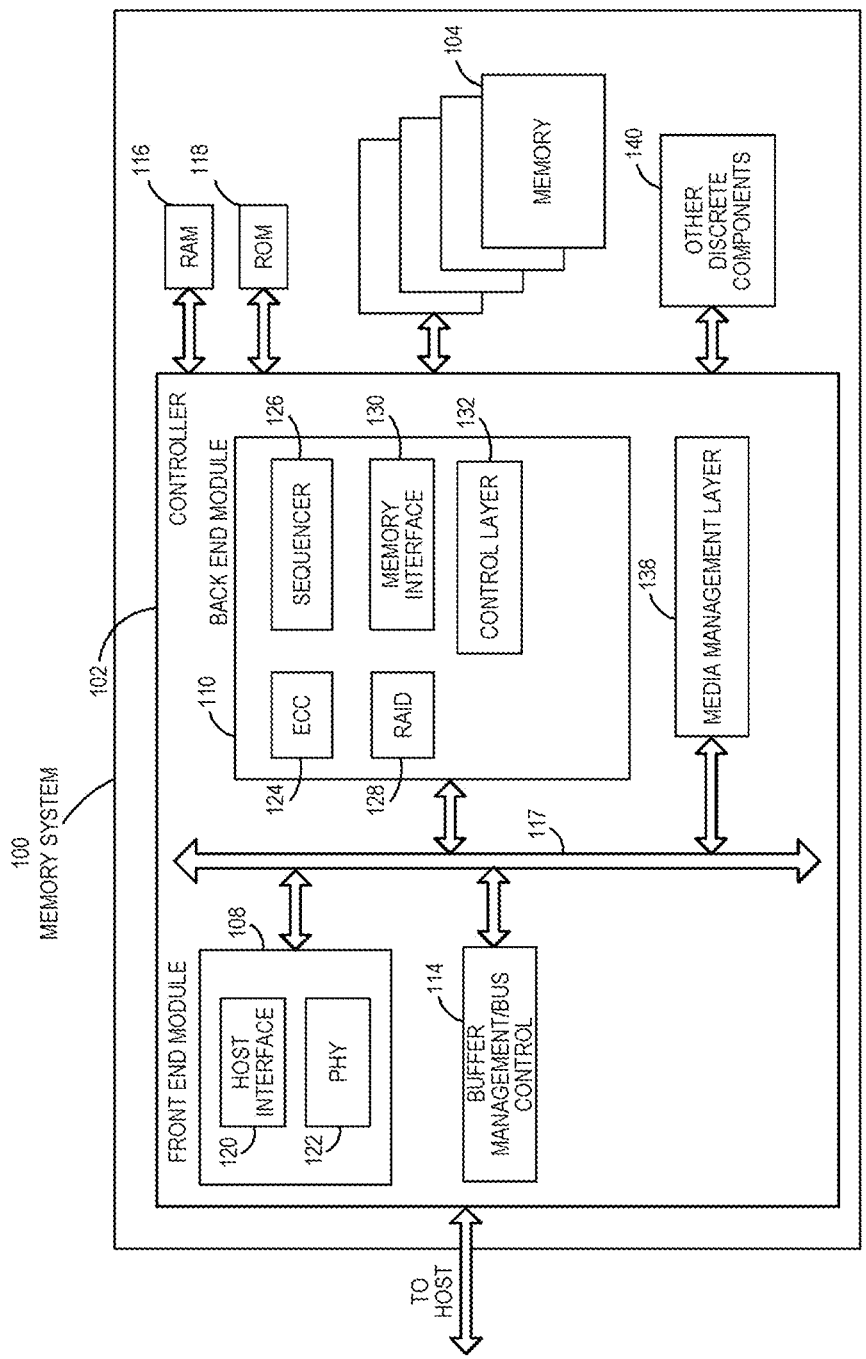
FIG. 2A is a block diagram of exemplary components of a controller of the non-volatile memory system of FIG. 1A according to aspects of the disclosure.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
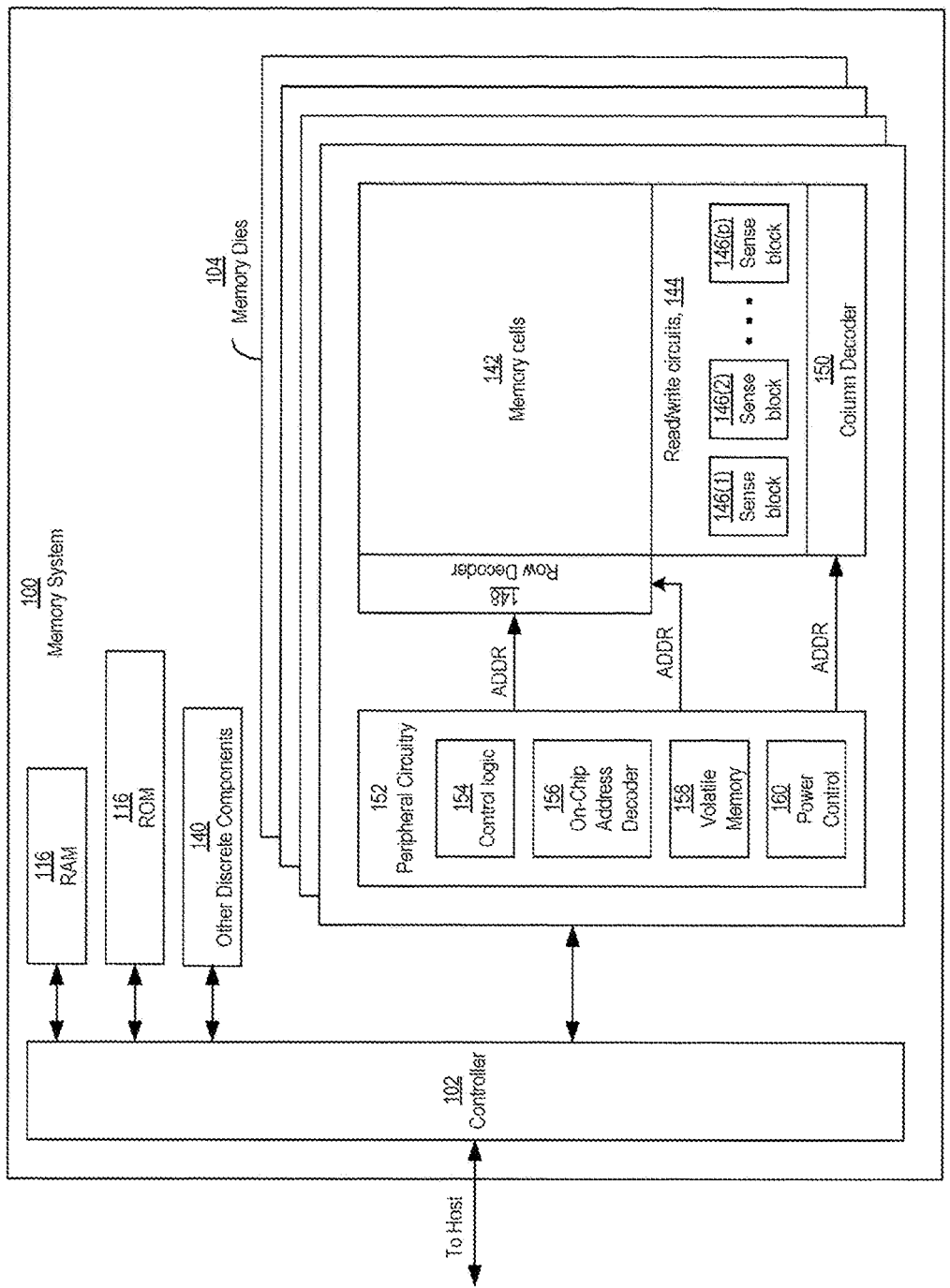
FIG. 2B is a block diagram of exemplary components of a non-volatile memory die of the non-volatile memory system of FIG. 1A according to aspects of the disclosure.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory elements in each column. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

For some memory configurations, such as flash memory, a memory cell of the plurality of memory cells 142 may be a floating gate transistor (FGT). FIG. 3 shows a circuit schematic diagram of an example FGT 300. The FGT 300 may include a source 302, a drain 304, a control gate 306, a floating gate 308, and a substrate 310. The floating gate 308 may be surrounded by an insulator or insulating material that helps retain charge in the floating gate 308. The presence or absence of charges inside the floating gate 308 may cause a shift in a threshold voltage of the FGT, which is used to distinguish logic levels. For each given charge stored in the floating gate 308, a corresponding drain-to-source conduction current ID with respect to a fixed control gate Voltage $V_{CG}$ applied to the control gate 306 occurs. Additionally, the FGT 300 may have an associated range charges that can be programmable onto its floating gate 308 that define a corresponding threshold voltage window or a corresponding conduction current window. In this way, the FGT's threshold voltage may be indicative of the data stored in the memory cell.

FIG. 4 is graph showing four curves 402, 404, 406, 408 of drain-to-source current ID drawn through the FGT 300 as a function of a control gate voltage $V_{CG}$ applied to the control gate 306. Each curve 402-408 corresponds to a respective one of four different charges or charge levels Q1, Q2, Q3, Q4 that the floating gate 308 can selectively store at any given time. Otherwise stated, the four curves 402-408 represent four possible charge levels that can be programmed on the floating gate 308 of the FGT 300, respectively corresponding to four possible memory states. In the example graph in FIG. 4, the threshold voltage window of a population of FGTs range from 0.5 volts (V) to 3.5 V. Seven possible memory states "0", "1", "2", "3", "4", "5", and "6" are defined or extend across the threshold voltage window, and respectively represent one erased states and six programmed states. The different states can be demarcated by partitioning the threshold voltage window into six regions of 0.5 V intervals. The FGT 300 may be in one of the states according to the charge stored in its floating gate 308 and where its drain-to-source current ID intersects a reference current $I_{REF}$. For example, a FGT programmed to store charge Q1 in memory state "1" since its curve 402 intersects the reference current $I_{REF}$ in a region of the threshold voltage region demarcated by the control gate voltage $V_{CG}$ in a range from 0.5 V to 1.0 V. The more memory states the FGT 300 is programmed to store, the more finely divided are the regions defining the threshold voltage window. In some examples configurations, the threshold voltage window may extend from −1.5 V to 5 V, providing a maximum width of 6.5 V. If the FGT 300 can be programmed into any one of sixteen possible states, each state may occupy a respective region spanning 200 millivolts (mV) to 300 mV. The higher the resolution of the threshold voltage window (i.e., more states into which the FGT 300 can be programmed), the higher the precision that is needed in programming and reading operations to successfully read and write data. Further description of memory states and threshold voltages is provided in further detail below with respect to programming, program verify, and read operations.

Referring to FIG. 5A, the memory cells 142 may be organized into an N-number of blocks, extending from a first block Block 1 to an Nth block Block N. Referring to FIG. 5B, for some example configurations, the N-number of blocks are organized into a plurality of planes. FIG. 5B shows an example configuration where the blocks are organized into two planes, including a first plane Plane 0 and a second plane Plane 1. Each plane is shown as included an M-number of blocks, extending from a first block Block 1 to an Mth block Block M. As shown, plane 0 includes even numbered blocks 0, 2, 4, . . . , etc. and plane 1 includes odd numbered blocks 1, 3, 5, . . . etc. It should be appreciated that although only two planes are shown, the memory apparatus could instead include 4 plane architecture (or a greater number of planes). The block address definition is 4n for plane 0, 4n+1 for plane 1, 4n+2 for plane 2 and 4n+3 for plane 3. Data stored in different planes may be sensed simultaneously or independently.

For configurations where the memory cells are organized into a two-dimensional array, the memory cells may be configured in a matrix-like structure of rows and columns in each of the blocks. At the intersection of a row and a column is a memory cell. A column of memory cells is a referred to as a string, and memory cells in a string are electrically connected in series. A row of memory cells is referred to as a page. Where the memory cells are FGTs, control gates of FGTs in a page or row may be electrically connected together.

Additionally, each of the blocks includes word lines and bit lines connected to the memory cells. Each page of memory cells is coupled to a word line. Where the memory cells are FGTs, each word line may be coupled to the control gates of the FGTs in a page. In addition, each string of memory cells is coupled to a bit line. Further, a single string may span across multiple word lines, and the number of memory cells in a string may be equal to the number of pages in a block.

Figure 6:
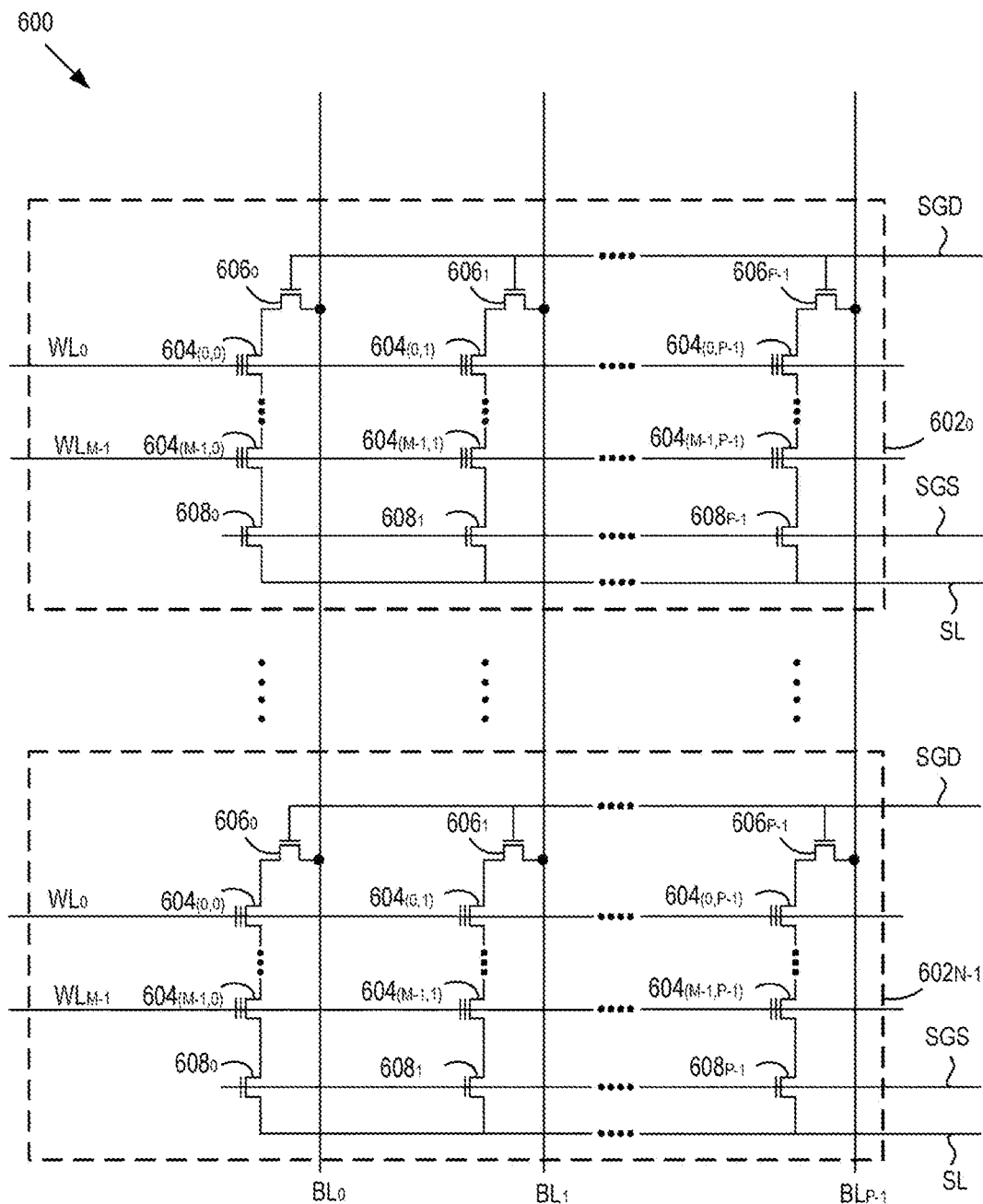
FIG. 6 is a circuit diagram of an example two-dimensional NAND-type flash memory array according to aspects of the disclosure.

FIG. 6 is a circuit schematic diagram of at least a portion of an exemplary two-dimensional NAND-type flash memory array 600, which may be representative of at least a portion of the plurality of memory cells 142. For example, the memory array 600 may be representative of a single plane of blocks on a memory die 104. The memory array 600 may include an N-number of blocks $602_0$ to $602_{N-1}$. Each block 602 includes a P-number of strings of FGTs 604, with each string coupled to respective one of a P-number of bit lines $BL_0$ to $BL_{P-1}$. Additionally, each block 602 includes an M-number of pages of FGTs 604, with each page coupled to a respective one of an M-number of word lines $WL_0$ to $WL_{M-1}$. Each ith, jth FGT(i,j) of a given block 602 is connected to an ith word line $WL_i$, and to a jth bit line $BL_j$ of the given block. As shown in FIG. 6, bit lines $BL_0$ to $BL_{P-1}$ are shared among the blocks $602_0$ to $602_{N-1}$ may be which are shared among the blocks, such as blocks within the same plane.

Within each block 602, each string is connected at one end to an associated drain select gate transistor 606, and each string is coupled to its associated bit line BL via the associated drain select gate transistor 606. Switching of the drain select gate transistors $606_0$ to $606_{P-1}$ may be controlled using a drain select gate bias line SGD that supplies a drain select gate bias voltage $V_{SGD}$ to turn on and off the drain select transistors $606_0$ to $606_{P-1}$. In addition, within each block 602, each string is connected at its other end to an associated source select gate transistor 608, and each string is coupled to a common source line SL via the associated source select gate transistor 608. Switching of the source select gate transistors $608_0$ to $608_{P-1}$ may be controlled using a source select gate bias line SGS that supplies a source select gate bias voltage VSGS to turn on and off the source select transistors $608_0$ to $608_{P-1}$. Also, although not shown, in some cases, dummy word lines, which contain no user data, can also be used in the memory array 600 adjacent to the source select gate transistors $608_0$ to $608_{P-1}$. The dummy word lines may be used to shield edge word lines and FGTs from certain edge effects.

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with two-dimensional (planar) NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
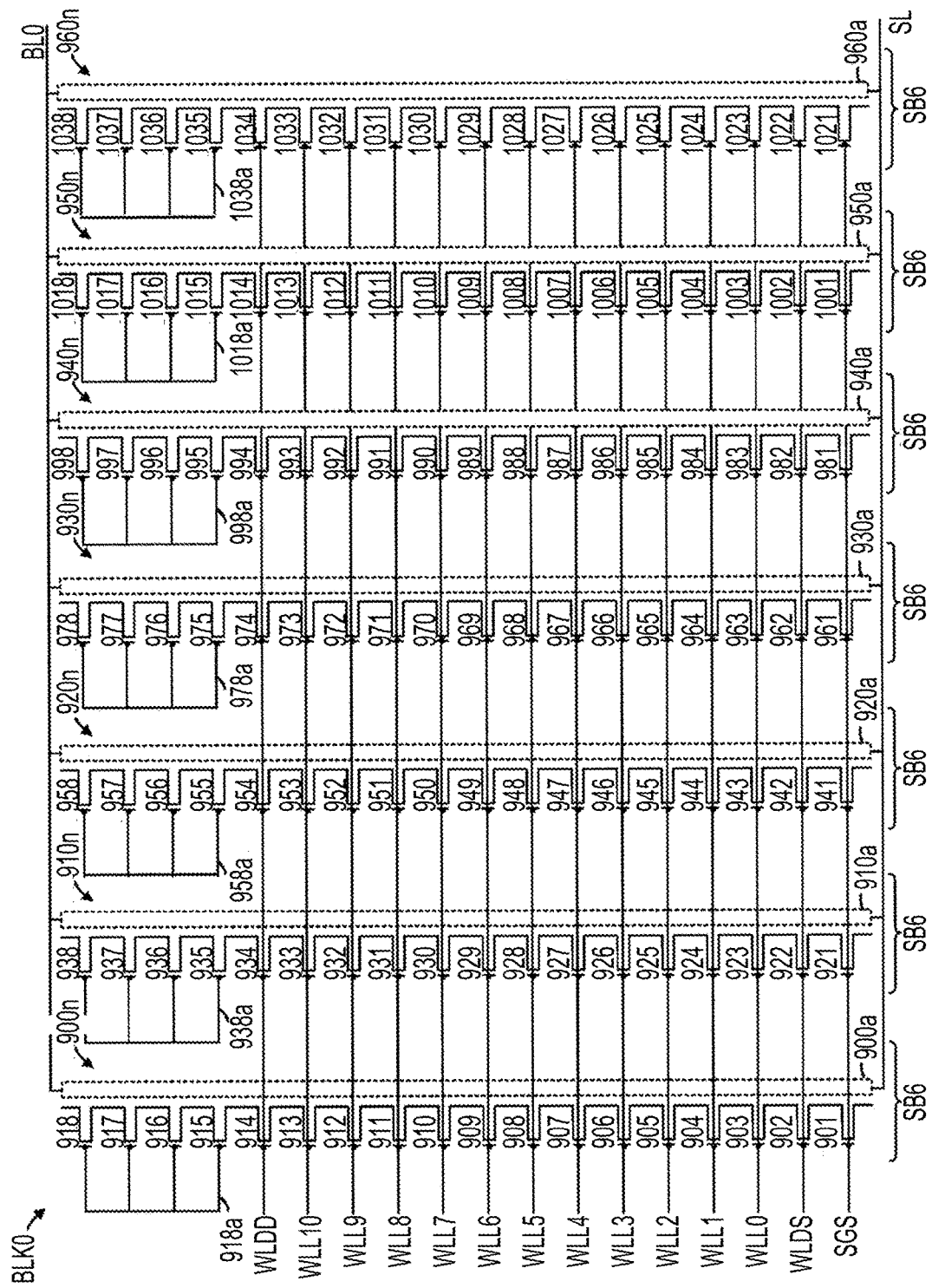
FIG. 9 depicts an example configuration of a block of a 3-D NAND memory array according to aspects of the disclosure.

Vertical NAND strings may be arranged to form a 3-D NAND array in various ways. FIG. 9 shows an example where multiple NAND strings in a block are connected to a bit line BL0. Specifically, a block BLK0 and its sub-blocks SB0-SB6 are shown. An example NAND string 900n, 910n, 920n, 930n, 940n, 950n and 960n is provided in SB0-SB6, respectively. In each sub-block, multiple NAND strings are provided. The NAND string 900n comprises a channel 900a, SGS transistor 901, source-side dummy memory cell 902 connected to source-side dummy word line WLDS, data memory cells 903-913, drain-side dummy memory cell 914 connected to drain-side dummy word line WLDD, and SGD transistors 915-918. This arrangement is convenient but is not essential and other patterns are also possible.

The NAND string 910n comprises a channel 910a, SGS transistor 921, source-side dummy memory cell 922 connected to source-side dummy word line WLDS, data memory cells 923-933, drain-side dummy memory cell 934 connected to drain-side dummy word line WLDD, and SGD transistors 935-938.

The NAND string 920n comprises a channel 920a, SGS transistor 941, source-side dummy memory cell 942 connected to source-side dummy word line WLDS, data memory cells 943-953, drain-side dummy memory cell 954 connected to drain-side dummy word line WLDD, and SGD transistors 955-958.

The NAND string 930n comprises a channel 930a, SGS transistor 961, source-side dummy memory cell 962 connected to source-side dummy word line WLDS, data memory cells 963-973, drain-side dummy memory cell 974 connected to drain-side dummy word line WLDD, and SGD transistors 975-978.

The NAND string 940n comprises a channel 940a, SGS transistor 981, source-side dummy memory cell 982 connected to source-side dummy word line WLDS, data memory cells 983-993, drain-side dummy memory cell 994 connected to drain-side dummy word line WLDD, and SGD transistors 995-998.

The NAND string 950n comprises a channel 950a, SGS transistor 1001, source-side dummy memory cell 1002 connected to source-side dummy word line WLDS, data memory cells 1003-1013, drain-side dummy memory cell 1014 connected to drain-side dummy word line WLDD, and SGD transistors 1015-1018.

The NAND string 960n comprises a channel 960a, SGS transistor 1021, source-side dummy memory cell 1022 connected to source-side dummy word line WLDS, data memory cells 1023-1033, drain-side dummy memory cell 1034 connected to drain-side dummy word line WLDD, and SGD transistors 1035-1038.

The SGD transistors 918, 938, 958, 978, 998, 918 and 938 are first, topmost SGD transistors in SB0-SB6, respectively, the SGD transistors 917, 937, 957, 977, 997, 1017 and 1037 are second SGD transistors in SB0-SB6, respectively, the SGD transistors 916, 936, 956, 976, 996, 1016 and 1036 are third SGD transistors in SB0-SB6, respectively, and the SGD transistors 915, 935, 955, 975, 995, 915 and 935 are fourth SGD transistors in SB0-SB6, respectively.

The source-ends of the NAND strings are connected to a common source line SL and the drain-ends of the NAND strings are connected to a common bit line BL0.

The SGD transistors can be connected in various ways within a NAND string, sub-block and block. In this example, within each sub-block SB0-SB6, the control gates of the SGD transistors 915-918, 935-938, 955-958, 975-978, 995-998, 1015-1018 and 1035-1038, respectively, are connected to one another by conductive paths 918a, 938a, 958a, 978a, 998a, 1018a and 1038a, respectively. The control gates of the SGD transistors in different sub-blocks are not connected to one another. In each sub-block, the connected SGD transistors in a NAND string are driven with a common control gate voltage. This provides a simplified implementation because one SGD driver is sufficient for each sub-block.

In an erase operation, GIDL is generated mainly in the first SGD transistor. This approach allows a different amount of GIDL to be generated in different sub-blocks by applying different SGD control gate voltages in different sub-block while a common bit line voltage is applied across all of the sub-blocks, for instance.

Figure 10A:
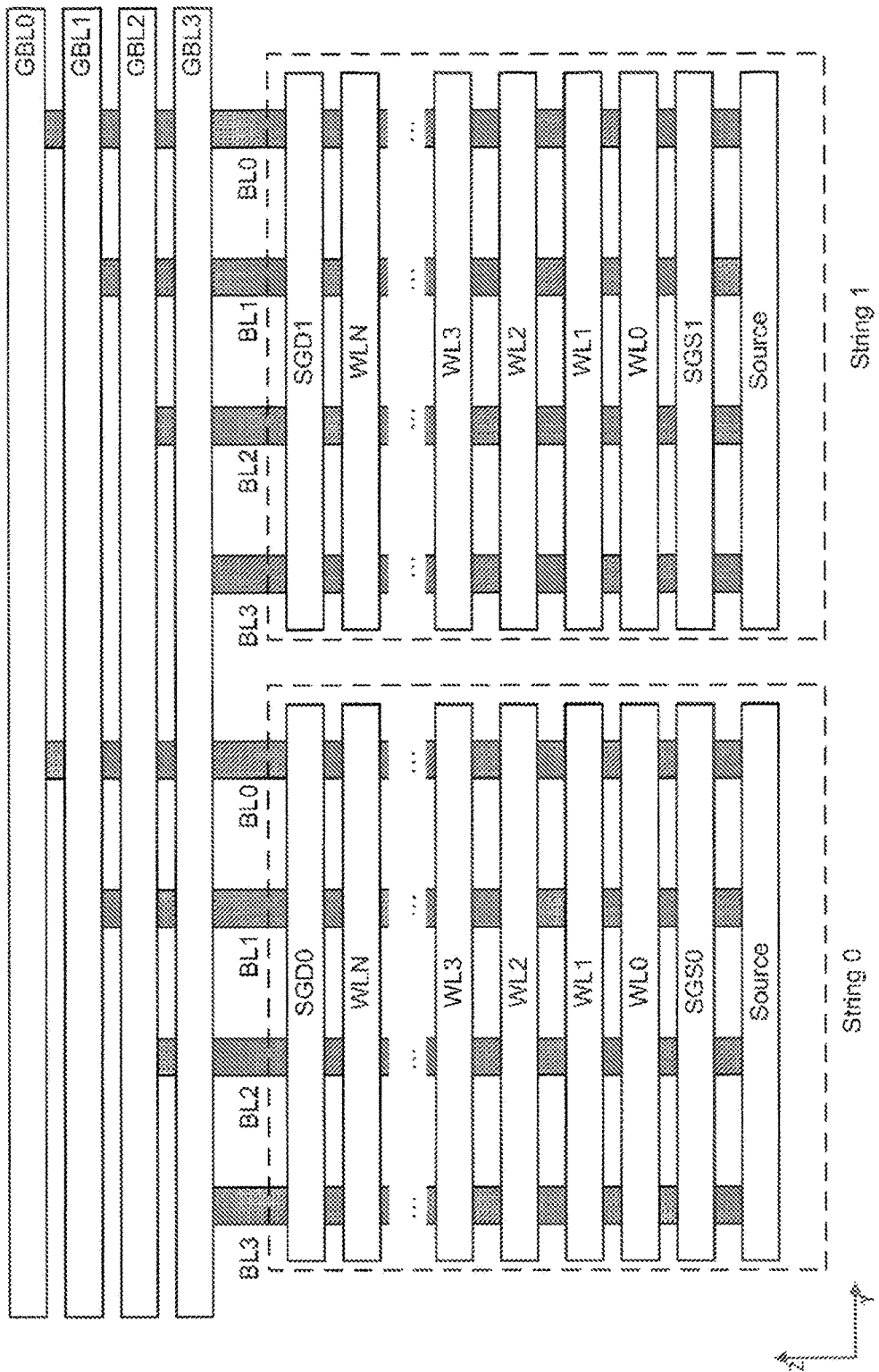
FIG. 10A is a cross-sectional view along the bit line direction (along the y-direction) of an example memory structure in which straight vertical NAND strings extend from common source connections in or near a substrate to global bit lines that extend over physical levels of memory cells according to aspects of the disclosure.

FIG. 10A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 10A shows only portions of GBL0 GBL3, and that these bit lines extend further in the y-direction and may connect with additional NAND strings in the block and in other blocks. Furthermore, additional bit lines extend parallel to GBL0-GBL3 (e.g. at different locations along x-axis, in front of, or behind the location of the cross-section of FIG. 10A).

Figure 10B:
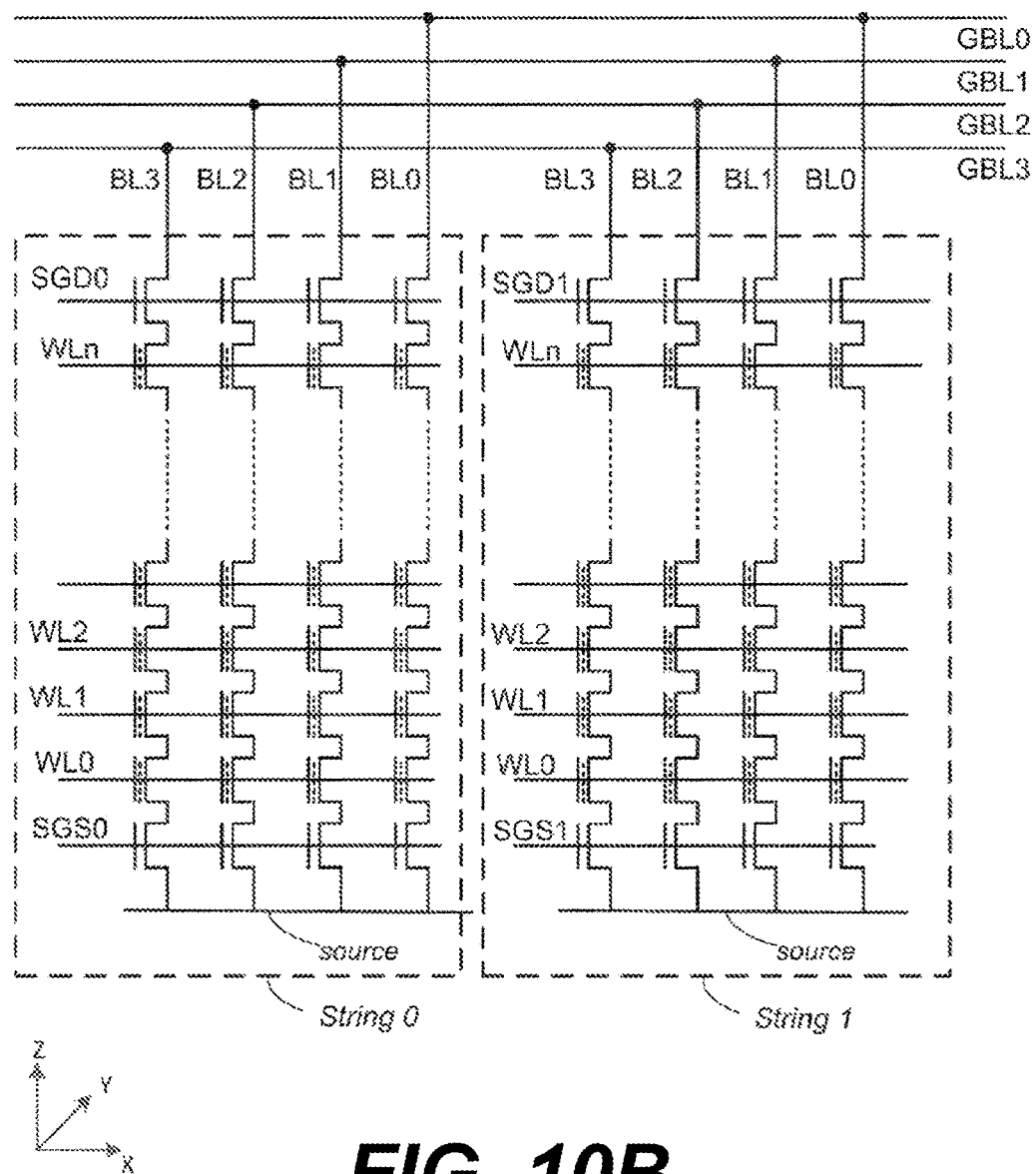
FIG. 10B is a circuit diagram of separately-selectable sets of NAND strings of FIG. 10A according to aspects of the disclosure.

FIG. 10B illustrates separately-selectable sets of NAND strings of FIG. 10A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

FIG. 10C shows a separately selectable set of NAND strings, String 0, of FIGS. 10A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming a page of memory cells in parallel.

The memory die 104 may also include a row address decoder 148 and a column address decoder 150. The row address decoder 148 may decode a row address and select a particular word line in the memory array 142 when reading or writing data to/from the memory cells 142. The column address decoder 150 may decode a column address to select a particular group of bit lines in the memory array 142 to read/write circuits 144.

In addition, the non-volatile memory die 104 may include peripheral circuitry 152. The peripheral circuitry 152 may include control logic circuitry 154, which may be implemented as a state machine that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including voltages (including program voltage pulses) to the word lines, erase voltages (including erase voltage pulses), the source select gate bias voltage $V_{SSG}$ to the source select gate bias line SSG, the drain select gate bias voltage $V_{DSG}$ to the drain select gate bias line DSG, a cell source voltage $V_{celsrc}$ on the source lines SL, as well as other voltages that may be supplied to the memory array 142, the read/write circuits 144, including the sense blocks 146, and/or other circuit components on the memory die 104. The various voltages that are supplied by the power control circuitry 160 are described in further detail below. The power control circuitry 160 may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations.

In order to program a target memory cell, and in particular a FGT, the power control circuitry 160 applies a program voltage to the control gate of the memory cell, and the bit line that is connected to the target memory cell is grounded, which in turn causes electrons from the channel to be injected into the floating gate. On the other hand, the bit line voltage is raised to VHSA to prevent electrons being injected into the floating gate, so-called as program inhibit. Peak current (Icc) occurs during the BL operation. The highest peak Icc occurs at the middle of program loop, in which a nearly equal amount of bit lines remains at ground and the other half rises to VHSA. A voltage difference among bit lines results in bit line—bit line coupling as well as severe peak Icc. During a program operation, the bit line that is connected to the target memory cell is referred to as a selected bit line. Conversely, a bit line that is not connected to a target memory cell during a program operation is referred to as an unselected bit line. In this context, a state of the bit line may refer to whether the bit line is selected or unselected. Otherwise stated, a bit line can be in one of two states, selected or unselected. When electrons accumulate in the floating gate, the floating gate becomes negatively charged and the threshold voltage $V_{TH}$ of the memory cell is raised. The power control circuitry 160 applies the program voltage VPGM on the word line that is connected to the target memory cell in order for the control gate of the target memory cell to receive the program voltage VPGM and for the memory cell to be programmed. As previously described, in a block, one memory cell in each of the NAND strings share the same word line. During a program operation, the word line that is connected to a target memory cell is referred to as a selected word line. Conversely, a word line that is not connected to a target memory cell during a program operation is referred to as an unselected word line.

Figure 11A:
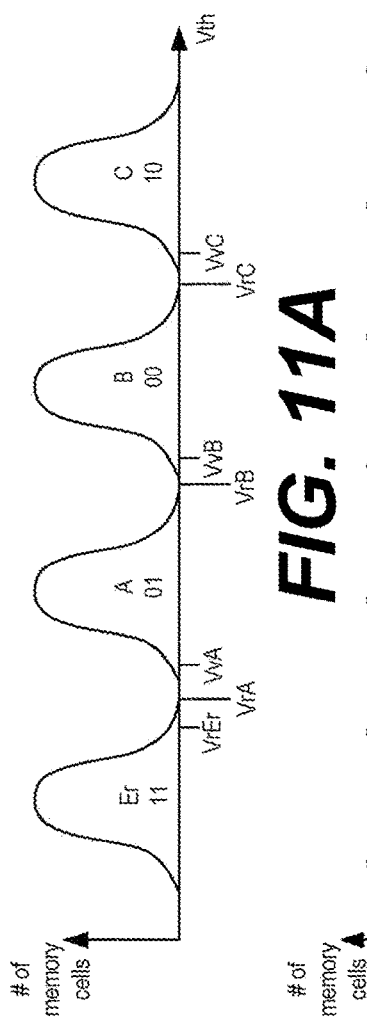
FIG. 11A is a plot of threshold voltage distribution curves for memory cells storing two bits of data according to aspects of the disclosure.
Figure 11B:
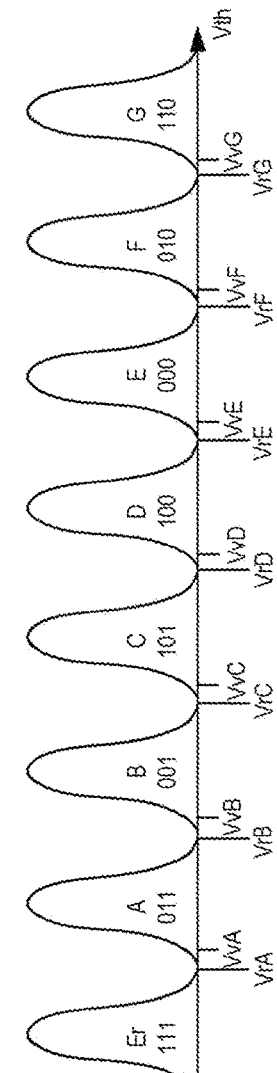
FIG. 11B is a plot of threshold voltage distribution curves for memory cells storing three bits of data according to aspects of the disclosure.
Figure 11C:
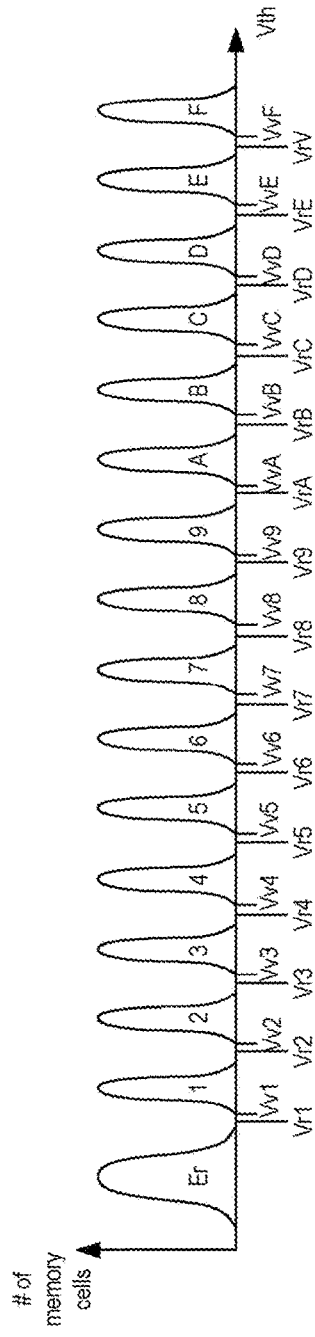
FIG. 11C is a plot of threshold voltage distribution curves for memory cells storing four bits of data according to aspects of the disclosure.

FIGS. 11A-11C are plots of threshold voltage distribution curves for different numbers of bits being stored the memory cells. The threshold voltage distribution curves are plotted for threshold voltage VTH as a function of the number of memory cells. FIG. 11A show threshold voltage distribution curves for memory cells programmed to store two bits of data, FIG. 11B show threshold voltage distribution curves for memory cells programmed to store three bits of data, and FIG. 11C show voltage distribution curves for memory cells programmed to store four bits of data. Similar threshold voltage distribution curves may be generated for memory cells programmed to store numbers of bits other than two, three, and four.

At a given point in time, each memory cell may be a particular one of a plurality of memory states (otherwise referred to as a data state). The memory states may include an erased stated and a plurality of programmed states. Accordingly, at a given point in time, each memory cell may be in the erased state or one of the plurality of programmed states. The number of programmed states corresponds to the number of bits the memory cells are programmed to store. With reference to FIG. 11A, for a memory cell programmed to store two bits, the memory cell may be in an erased state Er or one of three programmed states A, B, C. With reference to FIG. 11B, for a memory cell programmed to store three bits, the memory cell may be in an erased state Er or one of seven programmed states A, B, C, D, E, F, G. With reference to FIG. 11C, for a memory cell programmed to store four bits, the memory cell may be in an erased state Er or one of fifteen programmed states 1, 2, 3, 4, 5, 6, 7, 8, 9, A, B, C, D, E, F. As shown in FIGS. 11A-11C, each voltage distribution curve is associated with the erased state or one of the programmed states.

Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage $V_{TH}$ a memory cell has allows the data (i.e., the logic values of the bits) that the memory cell is storing to be determined. The specific relationship between the data programmed into the memory cells and the threshold voltage levels of the memory cell depends on the data encoding scheme used for programming the memory cells. In one example, as shown in FIGS. 11A and 11B, a Gray code scheme is used to assign data values to the threshold voltage distribution curves. Under this scheme, for memory cells programmed with two bits of data, the data value "11" is assigned to the range of threshold voltages associated with the erased state Er, the data value "01" is assigned to the range of threshold voltages associated with programmed state A, the data value "00" is assigned to the range of threshold voltages associated with programmed state B, and the data value "10" is assigned to the range of threshold voltages associated with the programmed state C. Similar relationships between data values and memory states can be made for memory cells programmed to store three bits, four bits, or other bits of data.

Prior to performance of a program operation that programs a plurality or group of target memory cells, all of the memory cells of the group subjected to and/or selected to be programmed in the programming operation may be in the erased state. During the programming operation, the power control circuitry 160 may apply the program voltage to a selected word line and in turn the control gates of the target memory cells as a series of program voltage pulses. The target memory cells being programmed concurrently are connected to the same, selected word line. In many programming operations, the power control circuitry 160 increases the magnitude of the program pulses with each successive pulse by a predetermined step size. Also, as described in further detail below, the power control circuitry 160 may apply one or more verify pulses to the control gate of the target memory cell in between program pulses as part of a program loop or a program operation. Additionally, during a programming operation, the power control circuitry 160 may apply one or more boosting voltages to the unselected word lines.

The target memory cells connected to the selected word line will concurrently have their threshold voltage change, unless they have been inhibited from programming. When the programming operation is complete for one of the target memory cells, the target memory cell is inhibited from further programming while the programming operation continues for the other target memory cells in subsequent program loops. Also, for some example programming operations, the control logic circuitry 154 may maintain a counter that counts the program pulses.

During a program operation to program a group of target memory cells, each target memory cell is assigned to one of the plurality of memory states according to write data that is to be programmed into the target memory cells during the program operation. Based on its assigned memory state, a given target memory cell will either remain the erased state or be programmed to a programmed state different from the erased state. When the control logic 154 receives a program command from the controller 102, or otherwise determines to perform a program operation, the write data in stored in latches included in the read/write circuitry 144. During the programming operation, the read/write circuitry 144 can read the write data to determine the respective memory state to which each of the target memory cells is to be programmed.

As described in further detail below, and as illustrated in FIGS. 11A-11C, each programmed state is associated with a respective verify voltage level $V_v$. A given target memory cell is programmed in its assigned memory state when its threshold voltage $V_{TH}$ is above the verify voltage $V_v$ associated with the memory state assigned to that target memory cell. As long as the threshold voltage $V_v$ of the given target memory cell is below the associated verify voltage $V_v$, the control gate of the target memory cell may be subject to a program pulse to increase the target memory cell's threshold voltage $V_{TH}$ to within the threshold voltage range associated with the memory state assigned to the given target memory cell. Alternatively, when the threshold voltage $V_{TH}$ of the given target memory cell increases to above the associated verify voltage level $V_v$, then programming may be complete for the given target memory cell. As described in further detail below, a sense block 146 may participate in a program operation that determines whether programming for a given memory cell is complete.

As previously mentioned, target memory cells subject to a program operation may also be subject to a verify operation that determines when programming is complete for each of the target memory cells. The verify operation is done in between program pulses, and so the programming operation and the verify operation in performed in an alternating or looped manner. The combination of the programming operation and the verify operation is called a program operation. Accordingly, a program operation includes a plurality of programming operations and a plurality of verify operations that are alternatingly performed. That is, a program operation involves a programming operation followed by a verify operation, followed by another programming operation, followed by another verify operation, and so on until the program operation has no more programming or verify operations to be performed. In addition, a single programming operation of a program operation includes the power control circuitry 160 supplying one or more program pulses to the selected word line for that single programming operation, and a single verify operation of a program operation includes the power control circuitry 160 supplying one or more verify pulses to the selected word line for that single programming operation. Accordingly, a program operation may include the power control circuitry 160 supplying a pulse train or a series of voltage pulses to the selected word line, where the pulse train includes one or more program pulses followed by one or more verify pulses, followed by one or more program pulses, followed by one or more verify pulses, and so on until the program-verify process has no more program or verify pulses for the power control circuitry 160 supply to the selected word line.

A program operation is complete when the verify portion of the program operation identifies that all of the memory cells have been programmed to their assigned threshold voltages $V_{TH}$. As mentioned, the verify process verifies or determines that a given target memory cell is finished being programmed when the verify process determines that the target memory cell's threshold voltage has increased to above the verify voltage level $V_v$ associated with the memory state to which the target cell is to be programmed.

For some example program operations, all of the target memory cells subject to a program operation are not subject to a single verify operation at the same time. Alternatively, for a single verify operation, only those target memory cells that are assigned to the same memory state are subject to a verify operation. For a single verify operation, target memory cells that are subject to the single verify operation are called selected memory cells or selected target memory cells, and target memory cells that are not subject to the single verify operation are called unselected memory cells or unselected target memory cells. Likewise, for a group of bit lines connected to the target memory cells of a program operation, bit lines connected to the selected memory cells for a single verify operation are called selected bit lines, and bit lines connected to the unselected memory cells for a single verify operation are called unselected bit lines. In this context, a state of the bit line may refer to whether the bit line is selected or unselected. Otherwise stated, a bit line can be in one of two states, selected or unselected.

For each of the verify operations, the power control circuitry 160, or some combination of the power control circuitry 160, the read/write circuitry 144, and the sense blocks 146, may supply voltages at appropriate levels to the selected and unselected word lines and the selected and unselected bit lines in order for a verify operation to be performed for the selected memory cells of the target memory cells subject to the program operation. For clarity, and unless otherwise specified, the combination of the power control circuitry 160, the read/write circuitry 144, and the sense blocks 146 used to bias the selected and unselected word lines and bit lines at appropriate levels during a given memory operation (e.g., a programming operation, a verify operation, a program operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof.

For performance of a verify operation in a block, the voltage supply circuitry may supply a drain select gate bias voltage $V_{SGD}$ on the drain select gate bias line SGD to the control gates of the drain select gate transistors (e.g., transistors 606 of FIG. 6) and a source select gate bias voltage VSGS on the source select gate bias line SGS to the control gates of the drain select gate transistors (e.g., transistors 608 of FIG. 6) at levels that turn on the drain select gate transistors and the source select gate transistors in response to the voltage supply circuitry supplying voltages at suitable levels on the common source line SL and to the bit lines.

Additionally, the voltage supply circuitry supplies a source line voltage at a cell source voltage level $V_{celsrc}$, otherwise referred to as the cell source voltage $V_{celsrc}$, on the common source line SL. Further, the voltage supply circuitry biases the drain side of the selected bit lines with a high supply voltage VHSA that is higher in magnitude than the cell source voltage $V_{celsrc}$. The difference between the high supply voltage VHSA and the cell source voltage level $V_{celsrc}$ may be great enough to allow current to flow from the drain side to the source side of a string that includes a selected target memory cell in the event that the selected target memory cell has a threshold voltage $V_{TH}$ that allows it to conduct a current. During a verify operation, a selected memory cell can be generally characterized as fully conducting, marginally conducting, or non-conducting, depending on the threshold voltage $V_{TH}$ of the selected memory cell. Also, the voltage supply circuitry biases the drain side of the unselected bit lines to the cell source voltage $V_{celsrc}$. By biasing the drain side and the source side of unselected bit lines to the cell source voltage $V_{celsrc}$, the voltage difference between the drain side and source side voltages will not allow current to flow through the NAND string connected to the unselected bit line. Further, the voltage supply circuitry biases the unselected word lines, and in turn the control gates of FGTs coupled to the unselected word lines, to a read voltage Vread. The read voltage is high enough to cause the FGTs coupled to unselected word lines to conduct a current regardless of its threshold voltage $V_{TH}$. In addition, the voltage supply circuitry biases the selected word line with a control gate reference voltage $V_{CGRV}$, which may be in the form of one or more verify pulses as previously described. The control gate reference voltage $V_{CGRV}$ may be different for verification of target memory cells of different memory states. For example, the voltage supply circuitry may supply a different control gate reference voltage $V_{CGRV}$ (or a control gate reference voltage $V_{CGRV}$ at different level) when verifying target memory cells programmed to state A than when verifying target memory cells programmed to state B, and so on.

Once the voltage supply circuitry supplies the voltages to the selected and unselected word lines and bit lines, and to the drain select gate transistors, source select gate transistors, drain select gate bias line SGD, and source select gate bias line SGS, a sense block can perform a sense operation that identifies whether a selected target memory cell is conducting, and in turn sufficiently programmed. Further details of the sense operation portion of the verify operation are described in further detail below.

As previously described, the threshold voltage $V_{TH}$ of a memory cell may identify the data value of the data it is storing. For a given read operation in a block, a memory cell from which data is to be read is referred to as a selected memory cell, and a memory cell from which data is not to be read is referred to as an unselected memory cell. So, when data is to be read from a page of memory cells for a particular read operation, those memory cells in the page are the selected memory cells, and the memory cells of the block that are not part of the page are the unselected memory cells. Additionally, a word line connected to the page of selected memory cells is referred to as the selected word line, and the other word lines of the block are referred to as the unselected word lines.

During a read operation to read data stored in target memory cells of a page, the sense blocks 146 may be configured to perform a sense operation that senses whether current is flowing through the bit lines connected to the target memory cells of the page. The voltage supply circuitry may supply voltages on the selected and unselected word lines at appropriate levels that cause current to flow or not to flow based on the threshold voltage $V_{TH}$ of the target memory cells. For some configurations, the level of the voltage supplied to the selected word lines may vary depending on the states of the memory cells.

The voltage supply circuitry may also bias the bit lines so that the high supply voltage VDDSA is applied to the drain side of the bit lines and the cell source voltage $V_{celsrc}$ is applied to the source side of the bit lines to allow for the current flow, provided that the threshold voltage $V_{TH}$ of the selected memory cell allows for it. For some example read configurations, where the sense block 146 can perform a sense operation for fewer than all of the memory cells of a page. For such configurations, the target memory cells of the page that are subject to and/or that are selected for a given sense operation are referred to as selected memory cells or selected target memory cells. Conversely, the target memory cells of the page that are not subject to and/or that are not selected for the sense operation are referred to as unselected memory cells. Accordingly, bit lines connected to selected target memory cells are referred to as selected bit lines, and bit lines connected to unselected target memory cells are referred to as unselected bit lines. In this context, a state of the bit line may refer to whether the bit line is selected or unselected. Otherwise stated, a bit line can be in one of two states, selected or unselected. The voltage supply circuitry can supply the voltages to the selected and unselected word lines and the selected and unselected bit lines at levels in various combinations and/or in various sequences and/or over various sense operations in order determine the threshold voltages of the target memory cells so that the data values of the data that the target memory cells are storing can be determined.

Figure 12:
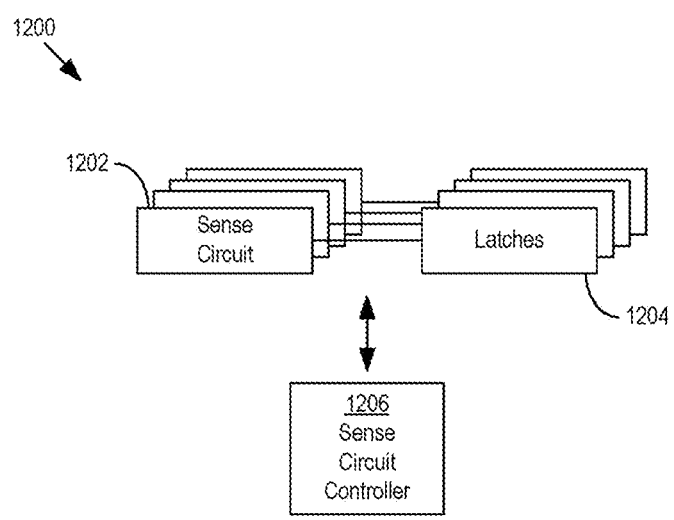
FIG. 12 is a block diagram of an example configuration of a sense block of FIG. 2B according to aspects of the disclosure.

FIG. 12 is a block diagram of an example configuration of a sense block 1200, which may be representative of one of the sense blocks 146(1) to 146(p) of FIG. 2B. The sense block 1200 may include a plurality of sense circuits 1202 and a plurality of sets of latches 1204. Each sense circuit (also referred to as a sense amplifier circuit) 1202 may be associated with a respective one of the latches 1204. That is, each sense circuit 1202 may be configured to communicate with and/or perform a sense operation using data and/or storing data into its associated latches set 1204. Additionally, the sense block 1200 may include a sense circuit controller 1206 that is configured to control operation of the sense circuits 1202 and the sets of latches 1204 of the sense block 1200. The sense circuit controller 1206 may be communicate with and/or may be a part of the control logic 154. The sense circuit controller 1206 may be implemented in hardware, or a combination of hardware and software. For example, the sense circuit controller 1206 may include a processor that executes computer instructions stored in memory to perform at least some of its functions.

As previously discussed, hosts or devices using the memory apparatus or device may have current consumption limitations. For example, the current limitation from the host may be a predetermined host current limit. Additionally, the predetermined host current limit that can be tolerated by the host or system is typically a fixed number that shall not be exceeded.

In other memory devices, it may be possible that with numerous planes (e.g., four planes) all with multiple dies operated in parallel, even more peak current may be required. Consequently, operational parameters may be trimmed in consideration of a worst case situation with the numerous planes being operated at once and these optimized trimmed parameters of the numerous planes used for the program operation should be able to survive under worst case scenario.

The use of a fewer number of planes than the total number of planes available actually happens quite often based on the device or system's usage of the memory cells. For example, if the amount of data that the host attempts to program is less than the entire capacity (4 planes, all pages) the system or apparatus will program only the needed planes (though all pages in case of full sequence, and in some cases due to apparatus "stuffing" some garbage to fill the other pages). It is common for the host to not have enough data to write the entire meta-block. In such a case the system or apparatus can use the "leftovers" or dummy data for the next chunk of data. Alternatively, it may be possible to try to gather data in the RAM (e.g., DRAM) in order to fill all the planes (i.e., the apparatus waits for more data), however, not all products include RAM due to its expense, or do not have enough RAM to store all the data.

Another case is when the host asks for "data commit" after sending the data. This means that the host will not send the next data until the memory apparatus finishes writing the current data (usually it means that a cache is not being used). Therefore, the apparatus needs to write the data to the memory cells and check the data integrity before committing to it. In such a case, the apparatus will rarely be able to program all the planes together.

Figure 13B:
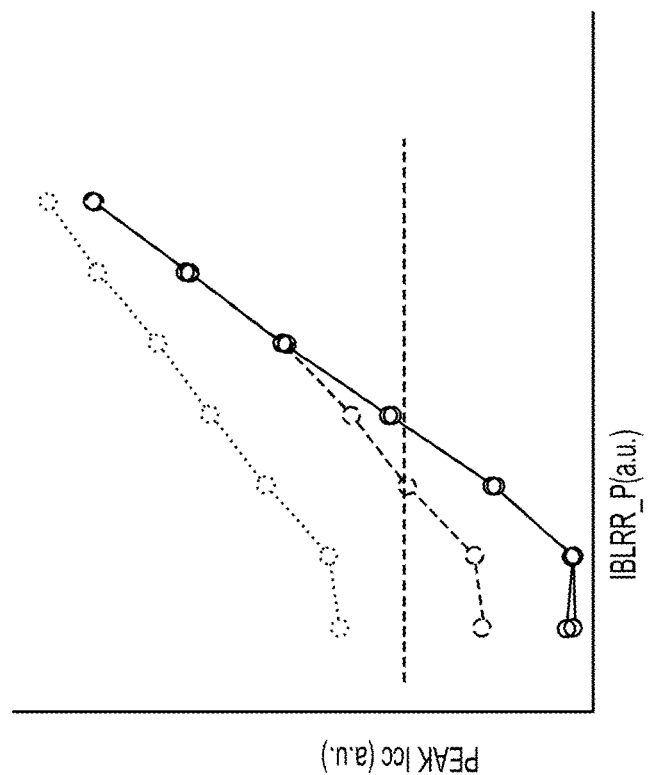
FIG. 13B shows a peak current versus the bit line voltage ramp rate parameter according to aspects of the disclosure.
Figure 13A:
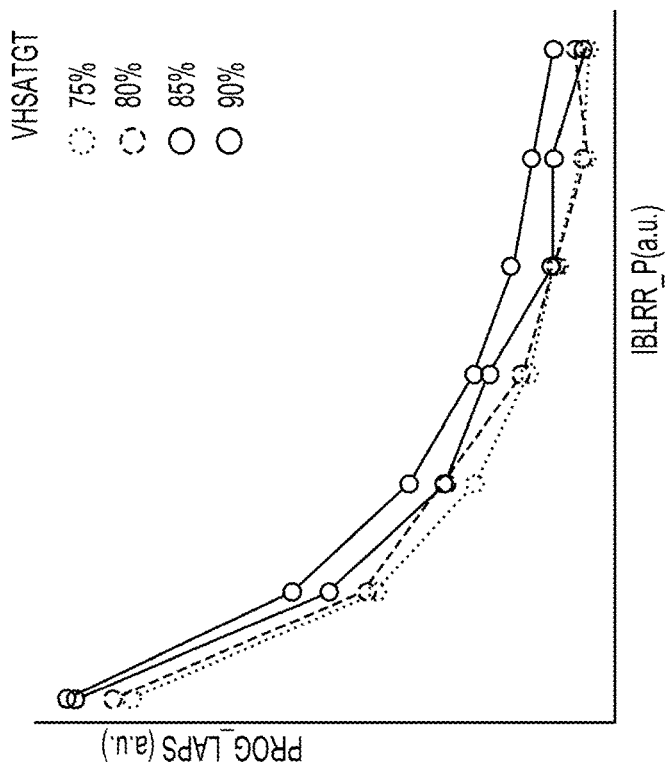
FIG. 13A shows a plot of programming time versus a bit line voltage ramp rate parameter according to aspects of the disclosure.

FIG. 13A shows a plot of programming time versus a bit line voltage ramp rate parameter, inhibit bit line ramp rate IBLRR_P for various target values of the inhibit bit line voltage VHSATGT. Before reaching the target value of the inhibit bit line voltage VHSATGT, the ramping speed is regulated (or controlled). After reaching the inhibit bit line voltage VHSATGT, there is no more control of the ramp rate or ramp speed. Therefore, the lower the percentage, the less the amount of bit line voltage needs to ramp up and consumes more current and vice versa. This parameter is also a trade-off between performance and power consumption.

FIG. 13B shows a peak current (Icc) versus the bit line voltage ramp rate parameter IBLRR_P for the various target values of the inhibit bit line voltage VHSATGT. Here, the bit line voltage ramp rate parameter IBLRR_P is related to the high sense amplifier voltage VHSA for the sense amplifier that is used to bias the bit line. The larger the amount of bit line voltage ramp rate parameter IBLRR_P (i.e., current) in each plot indicates a larger, more aggressive ramp rate of the high sense amplifier voltage. As shown, there is a tradeoff between program performance or speed and peak current Icc. Specifically, the better the program performance, the higher the peak Icc.

Figure 14B:
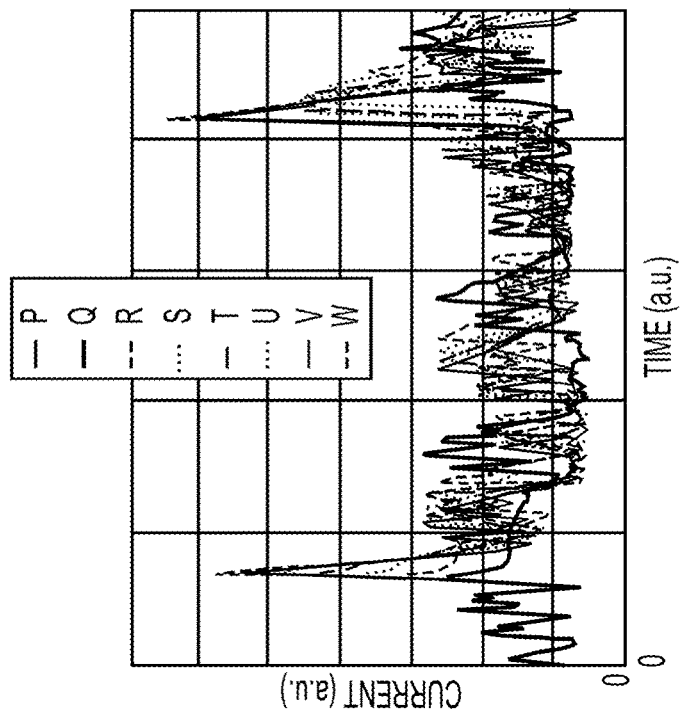
FIG. 14B shows a plot of the current consumption of the apparatus over a period of time during a program operation for multiple values of the bit line voltage ramp rate parameter according to aspects of the disclosure.
Figure 14A:
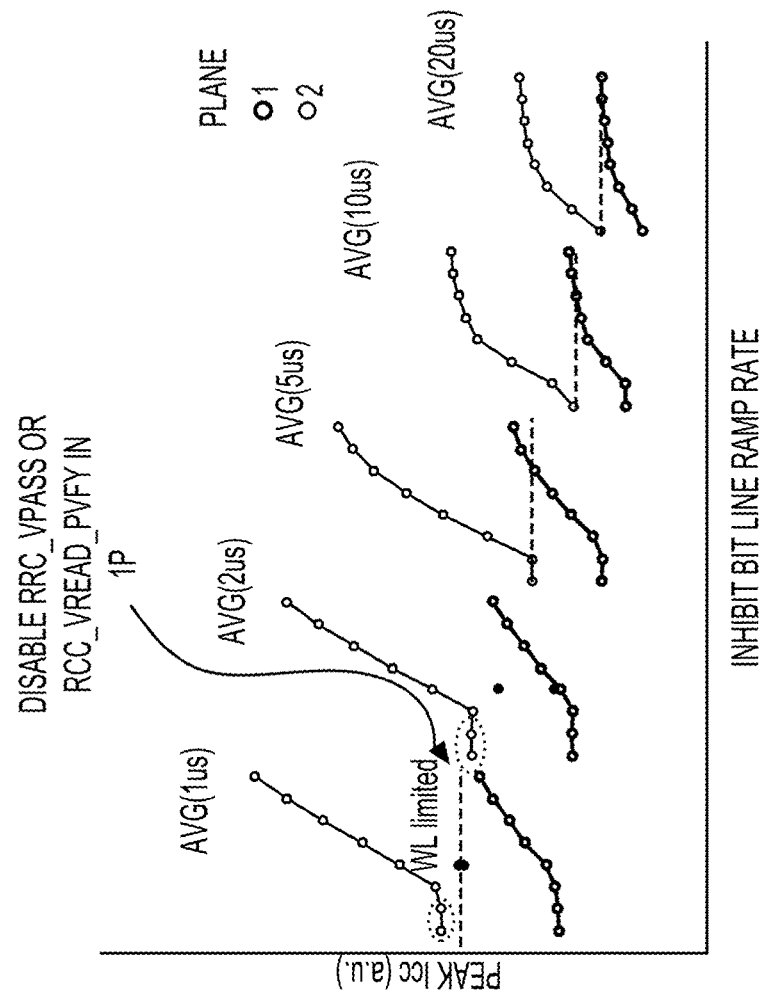
FIG. 14A shows a plot of the peak current versus the bit line voltage ramp rate parameter with various timing for an apparatus with two planes according to aspects of the disclosure.

FIG. 14A shows a plot of the peak current (Icc) versus the bit line voltage ramp rate parameter IBLRR_P with various timing (i.e., smooth) for an apparatus with two planes. Different power consumption specifications may need to be utilized. In the examples shown, the current consumption Icc is measured every 10 ns. If the power consumption specification is 1 us, the measured data will have a moving average among 100 rows of row data. Similarly, if the spec is 5 us, the measured data will have moving average among 500 rows of data. So, the higher the "smooth", the flatter the figure and the smaller the power consumption specification target. As shown, there is a limitation due to the word lines and the smallest difference in settings (DAC) for all smooth or power consumption specifications is 4 DAC. FIG. 14B shows a plot of the current consumption of the apparatus over a period of time during a program operation for multiple values of the bit line voltage ramp rate parameter IBLRR_P (P, Q, R, S, T, U, V, W). As shown, the peak current is primarily due to the ramp rate of the voltage on the bit lines (the higher amplitude peaks at either end of the plot), rather than the ramping of the voltage of the word lines (the central region of the plot with lower amplitude).

Using parameters optimized for numerous plane operation (e.g., four planes) when the program operation involves a fewer number of planes will result in the same performance (program time/Tprog), but with much lower peak current. So, since the allowable peak current is fixed, the fewer number of planes can use a more aggressive ramp rate of the optimized parameters as well as their corresponding clocks or timing on bit lines (BL) and word lines (WL) for further performance gain.

Accordingly, provided herein is an apparatus (e.g., memory system 100 of FIGS. 1A-2B) including a plurality of memory cells (e.g., memory cell 142 of FIG. 2B, floating gate transistor 300 of FIG. 3, FGTs 604 of FIG. 6) connected to word lines (e.g., $WL_0$ to $WL_{M-1}$ of FIG. 6) and bit lines (e.g., $BL_0$ to $BL_{P-1}$ of FIG. 6) and arranged in a plurality of planes (e.g., plane 0, plane 1 of FIG. 5B). A control circuit (e.g., controller 102 and peripheral circuitry 152 of FIGS. 1A-2B, storage controllers 202 of FIG. 1C, sense block 1200) is coupled to the word lines and the bit lines and is configured to determine whether a program operation of the plurality of memory cells involves all of the plurality of planes. In response to the program operation of the plurality of memory cells not involving all of the plurality of planes, the control circuit is configured to adjust at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation. Alternatively, the control circuit is further configured to apply the bit line voltage to the bit lines with a predetermined default trimmed bit line ramp rate in response to the program operation of the plurality of memory cells involving all of the plurality of planes. Similarly, the control circuit is configured to apply the at least one word line voltage to the word lines with a predetermined default trimmed word line ramp rate during the program operation of the plurality of memory cells in response to the program operation of the plurality of memory cells involving all of the plurality of planes.

As discussed above with reference to FIGS. 11A-11C, the program operation can comprise multiple loops with each loop including one program pulse to raise the threshold voltage $V_{TH}$ to a target threshold voltage $V_{TH}$ and one verify operation or program verify to check the threshold voltage $V_{TH}$ of the memory cells being programmed. So, if the memory cells connected to one of the bit lines reaches an intended or target threshold voltage $V_{TH}$, no further program pulses are necessary. Thus, the bit lines include a plurality of uninhibited bit lines being programmed at a time and a plurality of inhibited bit lines not being programmed at the time during the program operation. According to an aspect, the bit line voltage is an inhibit voltage (i.e., VHSA) applied to the plurality of inhibited bit lines. Specifically, the bit lines either ramp up to VDDSA or remain at Vss (0V) depending on whether the memory cells associated with these bit lines memory unit will be programmed or not. So, if the memory cells connected to one of the bit lines reaches the intended or target threshold voltage $V_{TH}$, that bit line will be raised to VDDSA to inhibit further programming. Nevertheless, it should be appreciated that the bit line voltage may be another voltage.

In order to adjust the bit line ramp rate of the bit line voltage applied to the bit lines, a "shift" parameter "DIBLRR_P_PB" can be stored in memory (e.g., in ROM 118 of FIGS. 2A and 2B) for fewer than the total number of planes to use a more aggressive bit line ramp rate. A determination can be made ahead of time (e.g., before production) how "aggressive" the bit line ramp rate change used for fewer planes program operation. So, according to an aspect, the apparatus includes a default bit line voltage ramp rate lookup table with the bit line voltage ramp rate parameter or a plurality of default bit line voltage ramp rates IBLRR_P of the bit line voltage. The apparatus also includes a shifted bit line voltage ramp rate lookup table having a plurality of "shift" parameters or bit line shift offsets DIBLRR_P_PB. FIGS. 15A and 15B show an example default bit line voltage ramp rate lookup table and an example shifted bit line voltage ramp rate lookup table used for adjusting the bit line ramp rate of the bit line voltage applied to the bit lines. The control circuit is configured to reference the default bit line voltage ramp rate lookup table and the shifted bit line voltage ramp rate lookup table and determine which of the plurality of default bit line voltage ramp rates IBLRR_P is used in the program operation according to one of the plurality of bit line shift offsets DIBLRR_P_PB selected and based on the quantity of the plurality of planes associated with the plurality of memory cells being program-verified in the program operation.

Thus, for example, if the plurality of planes includes a total of four planes, a program operation involving all four planes uses one of plurality of default bit line voltage ramp rates IBLRR_P for the bit line voltage. Specifically, one of plurality of default bit line voltage ramp rates IBLRR_P is chosen ahead of time to be used for the apparatus (e.g., determined during product development and used during production). Similarly, one of the plurality of bit line shift offsets DIBLRR_P_PB is chosen ahead of time to be used for the apparatus (e.g., determined during product development and used during production). If the program operation involves fewer than the total number of planes, the bit line voltage ramp rate used is selected with reference to one of the plurality of bit line shift offsets DIBLRR_P_PB of the shifted bit line voltage ramp rate lookup table. For example, the bit line voltage ramp rate used is the one of the plurality of default bit line ramp rates IBLRR_P plus the one of the plurality of bit line shift offsets DIBLRR_P_PB (i.e., IBLRR_P+DIBLRR_P_PB for three planes). Similarly, if the program operation involves only two of the four planes, the bit line voltage ramp rate used is the one of the plurality of default bit line ramp rates IBLRR_P plus two multiplied by the one of the plurality of bit line shift offsets DIBLRR_P_PB (i.e., IBLRR_P+2*DIBLRR_P_PB for two planes). In addition, if the program operation involves only one of the four planes, the bit line voltage ramp rate used is the one of the plurality of default bit line ramp rates IBLRR_P plus three multiplied by the one of the plurality of bit line shift offsets DIBLRR_P_PB (i.e., IBLRR_P+3*DIBLRR_P_PB for one plane).

Consequently, if the one of the plurality of default bit line voltage ramp rates for the apparatus is chosen to be B2 in the default bit line voltage ramp rate lookup table for a program verify operation involving all four planes and the one of the plurality of bit line shift offsets chosen for the apparatus is +1 DAC, a program operation involving only three of the four planes would use the B3 ramp rate. A program operation involving only two of the four planes would use the B4 ramp rate and a program operation involving only one of the four planes would use the B5 ramp rate. However, if the one of the plurality of bit line shift offsets DIBLRR_P_PB chosen for the apparatus is instead +2 DAC, a program operation involving only three of the four planes would use the B4 ramp rate. A program operation involving only two of the four planes would use the B6 ramp rate and a program operation involving only one of the four planes would use the B8 ramp rate.

Furthermore, whenever the bit line voltage ramp rate determined based on the default bit line voltage ramp rate lookup table and the shifted bit line voltage ramp rate lookup table exceeds a maximum one of the plurality of default bit line voltage ramp rates IBLRR_P (i.e., DAC), the control circuit is configured to use the maximum one of the plurality of default bit line voltage ramp rates IBLRR_P (e.g., the B8 ramp rate).

Figure 16:
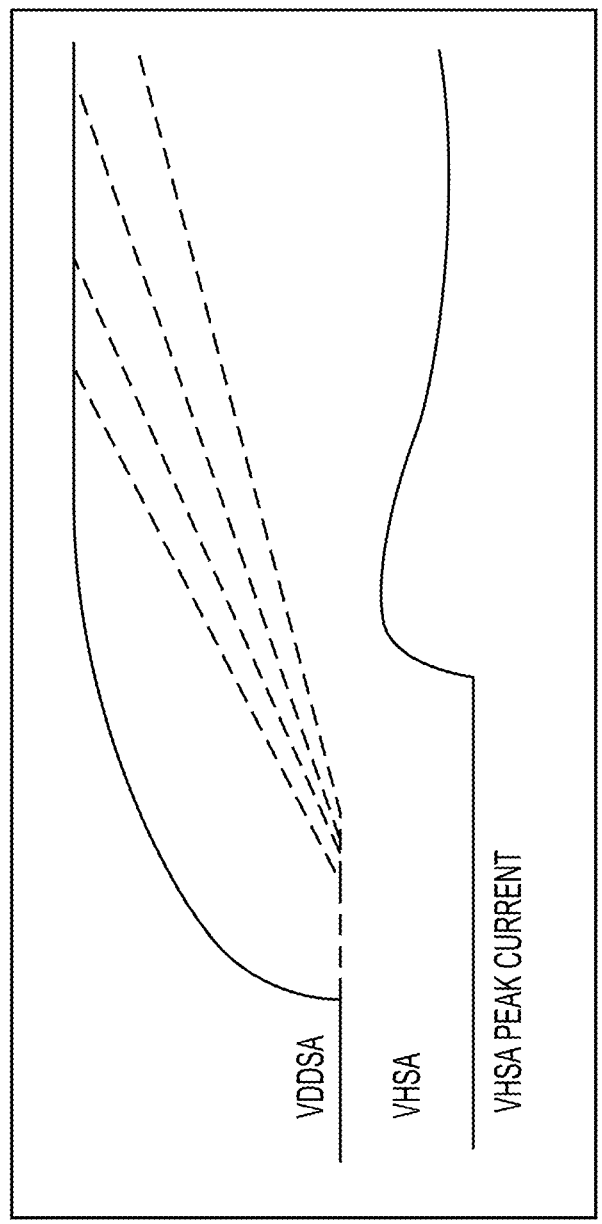
FIG. 16 shows an example plot of high voltage supply levels VDDSA, VHSA and corresponding peak current according to aspects of the disclosure.

So, the bit line voltage is ramped according to the default bit line voltage ramp rate lookup table and the shifted bit line voltage ramp rate lookup table and based on the quantity of the plurality of planes associated with the plurality of memory cells being program-verified in the program operation during a bit line voltage ramping time period of the program operation. According to an aspect, the control circuit is configured to automatically determine the bit line voltage ramping time period used in the program operation based on the ramping of the bit line voltage according to the default bit line voltage ramp rate lookup table and the shifted bit line voltage ramp rate lookup table and based on the quantity of the plurality of planes associated with the plurality of memory cells being program-verified in the program operation. The timing for ramping the inhibit bit line voltage includes self-feedback in the bit line power circuit. The faster the ramp rate, the timing is automatically made shorter. So, for the bit line ramping clock, the bit line voltage ramping time period (e.g., P5) is determined automatically when the high voltage supply VHSA achieves 75-90% of a high voltage supply level VDDSA. FIG. 16 shows an example plot of VDDSA, VHSA and corresponding VHSA peak current.

As previously discussed, the word lines include a selected word line being program-verified at a time and a plurality of unselected word lines not being program-verified at the time during the program operation. In addition, the at least one word line voltage includes a pass voltage Vpass applied to the plurality of selected and unselected word lines during a programming portion of the program operation. To adjust the word line ramp rate of the pass voltage Vpass applied to the plurality of unselected word lines, the apparatus includes a default pass voltage ramp rate lookup table having a plurality of default pass voltage ramp rates RRC_VPASS. The apparatus also includes a shifted pass voltage ramp rate lookup table having a plurality of pass voltage shift offsets DRRC_VPASS_PB. FIGS. 17A and 17B show an example default pass voltage ramp rate lookup table and an example shifted pass voltage ramp rate lookup table. In the examples shown, the larger the number, the slower the ramp rate. The control circuit is further configured to shift one of the plurality of default pass voltage ramp rates RRC_VPASS used in the program operation according to one of the plurality of pass voltage shift offsets DRRC_VPASS_PB and based on the quantity of the plurality of planes associated with the plurality of memory cells being program-verified in the program operation.

Thus, for example, if the plurality of planes includes a total of four planes, a program operation involving all four planes uses one of plurality of default pass voltage ramp rates RRC_VPASS when the at least one word line voltage is the pass voltage Vpass. As with the one of plurality of default bit line voltage ramp rates IBLRR_P, the one of plurality of default pass voltage ramp rates RRC_VPASS is chosen ahead of time to be used for the apparatus (e.g., determined during product development and used during production). Similarly, one of the plurality of pass voltage shift offsets DRRC_VPASS_PB is chosen ahead of time to be used for the apparatus (e.g., determined during product development and used during production). If the program operation involves fewer than all of the four planes, the pass voltage ramp rate used is selected with reference to one of the plurality of pass voltage shift offsets DRRC_VPASS_PB of the shifted pass voltage ramp rate lookup table. For example, the pass voltage ramp rate used for three planes is the one of the plurality of default pass voltage ramp rates RRC_VPASS plus the one of the plurality of pass voltage shift offsets DRRC_VPASS_PB (i.e., RRC_VPASS+DRRC_VPASS_PB for three planes). Similarly, if the program operation involves only two of the four planes, the pass voltage ramp rate used is the one of the plurality of default pass voltage ramp rates RRC_VPASS plus two multiplied by the one of the plurality of pass voltage shift offsets DRRC_VPASS_PB (i.e., RRC_VPASS+2*DRRC_VPASS_PB for three planes). In addition, if the program operation involves only one of the four planes, the pass voltage ramp rate used is the one of the plurality of default pass voltage ramp rates RRC_VPASS plus two multiplied by the one of the plurality of pass voltage shift offsets DRRC_VPASS_PB (i.e., RRC_VPASS+3*DRRC_VPASS_PB for three planes).

Accordingly, if the one of the plurality of default pass voltage ramp rates for the apparatus is chosen to be RRC disable (meaning that no ramp rate control is used) in the default pass voltage ramp rate lookup table for a program verify operation involving all four planes and the one of the plurality of pass voltage shift offsets chosen for the apparatus is −1 DAC, a program operation involving only three of the four planes would use the Y3 pass voltage ramp rate. A program operation involving only two of the four planes would use the Y2 pass voltage ramp rate and a program operation involving only one of the four planes would use the Y1 pass voltage ramp rate. Here, the Y1 ramp rate is less than the Y2 and Y3 ramp rates.

Moreover, whenever the pass voltage ramp rate determined based on the default pass voltage ramp rate lookup table and the shifted pass voltage ramp rate lookup table exceeds a minimum one of the plurality of default pass voltage ramp rates RRC_VPASS (i.e., DAC), the control circuit is configured to use the minimum one of the plurality of default pass voltage ramp rates RRC_VPASS (e.g., the Y4 pass voltage ramp rate, or another value smaller than Y1).

In addition, the at least one word line voltage includes a read voltage Vread applied to the plurality of selected and unselected word lines during a verify portion of the program operation. Such ramping to the read voltage Vread occurs prior to the program verify and is also known as "Vread spike" operation. The purpose of the Vread spike is to drain residue electrons in the channel before a following sensing operation. If no Vread spike operation is used, hot carrier injection can occurs in dummy word lines (e.g., WLDS and WLDD of FIG. 9). After several erase/program cycles, the threshold voltage $V_{TH}$ of memory cells associated with the dummy word lines will be disturbed and will impact the reading of data word lines (i.e., word lines that are not dummy word lines).

So, similar to the pass voltage Vpass, to adjust the word line ramp rate of the read voltage Vread applied to the plurality of selected and unselected word lines, the apparatus includes a default read pass voltage ramp rate lookup table having a plurality of default read voltage ramp rates RRC_VREAD_PVFY. The apparatus also includes a shifted read voltage ramp rate lookup table having a plurality of read voltage shift offsets DRRC_VREAD_PVFY_PB. FIGS. 18A and 18B show an example default read voltage ramp rate lookup table and an example shifted read voltage ramp rate lookup table. In the examples shown, the larger the number, the slower the ramp rate. Thus, the control circuit is further configured to shift one of the plurality of default read voltage ramp rates RRC_VREAD_PVFY used in the program operation according to one of the plurality of read voltage shift offsets DRRC_VREAD_PVFY_PB and based on the quantity of the plurality of planes associated with the plurality of memory cells being program-verified in the program operation.

Therefore, for example, if the plurality of planes includes a total of four planes, a program operation involving all four planes uses one of plurality of default read voltage ramp rates RRC_VREAD_PVFY when the at least one word line voltage is the read voltage. The one of plurality of default read voltage ramp rates is chosen ahead of time to be used for the apparatus (e.g., determined during product development and used during production). Similarly, one of the plurality of read voltage shift offsets is chosen ahead of time to be used for the apparatus (e.g., determined during product development and used during production). If the program operation involves fewer than all of the four planes, the read voltage ramp rate used is selected with reference to one of the plurality of read voltage shift offsets of the shifted read voltage ramp rate lookup table. For example, the read voltage ramp rate used for three planes is the one of the plurality of default read voltage ramp rates RRC_VREAD_PVFY plus the one of the plurality of read voltage shift offsets DRRC_VREAD_PVFY_PB (i.e., RRC_VREAD_PVFY+DRRC_VREAD_PVFY_PB for three planes). Similarly, if the program operation involves only two of the four planes, the read voltage ramp rate used is the one of the plurality of default read voltage ramp rates RRC_VREAD_PVFY plus two multiplied by the one of the plurality of read voltage shift offsets DRRC_VREAD_PVFY_PB (i.e., RRC_VREAD_PVFY+2*DRRC_VREAD_PVFY_PB for three planes). In addition, if the program operation involves only one of the four planes, the read voltage ramp rate used is the default read voltage ramp rate RRC_VREAD_PVFY plus two multiplied by the one of the plurality of read voltage shift offsets DRRC_VPASS_PB (i.e., RRC_VREAD_PVFY+3*DRRC_VREAD_PVFY_PB for three planes).

Accordingly, if the one of the plurality of default read voltage ramp rates for the apparatus is chosen to be Z6 in the default read voltage ramp rate lookup table for a program verify operation involving all four planes and the one of the plurality of read voltage shift offsets DRRC_VREAD_PVFY_PB chosen for the apparatus is −1 DAC, a program operation involving only three of the four planes would use the Z5 read voltage ramp rate. A program operation involving only two of the four planes would use the Z4 read voltage ramp rate and a program operation involving only one of the four planes would use the Z3 read voltage ramp rate. However, if the one of the plurality of bit line shift offsets DRRC_VREAD_PVFY_PB chosen for the apparatus is instead −2 DAC, a program operation involving only three of the four planes would use the Z4 read voltage ramp rate. A program operation involving only two of the four planes would use the Z2 read voltage ramp rate and a program operation involving only one of the four planes would use the disable read voltage ramp rate. Here, the Z2 ramp rate is less than the Z3 and Z4 ramp rates.

Also, whenever the read voltage ramp rate determined based on the default read voltage ramp rate lookup table and the shifted read voltage ramp rate lookup table exceeds a minimum one of the plurality of default read voltage ramp rates RRC_VREAD_PVFY (i.e., DAC), the control circuit is configured to use the minimum one of the plurality of default read voltage ramp rates RRC_VREAD_PVFY (e.g., the disable ramp rate). While the at least one word line voltage is discussed as the pass voltage Vpass and the read voltage Vread, it should be understood that the ramping of other voltages applied to the word line may be adjusted instead.

The timing of the bit line ramping is discussed above as being automatically adjusted based the timing of the based on the ramping of the bit line voltage per the default bit line voltage ramp rate lookup table and the shifted bit line voltage ramp rate lookup table and based on the quantity of the plurality of planes associated with the plurality of memory cells being program-verified in the program operation. In contrast, according to an aspect, the ramping of the at least one word line voltage (e.g., Vpass or Vread) is not automatic and is instead determined based on additional lookup tables. In other words, unlike the feedback control that is utilized for the timing of the bit line ramping, the word line ramping does not have feedback control and instead, the corresponding timing parameter is optimized manually. More specifically, the pass voltage ramp rate RRC_VPASS clock or pass voltage ramping time period of the program operation (e.g., P13, a thirteenth time period of a P-clock period associated with the program operation) and read voltage ramp rate RRC_VREAD_PVFY clock or read voltage ramping time period of the program operation (e.g., R2_PVFY, a second time period of an R-clock period during program verify) are dependent on the number of planes involved, as discussed in more detail below. Thus, the apparatus disclosed herein can use a more aggressive bit line ramp rate and a more aggressive word line ramp rate as well as corresponding timing for program operation which further boosts the performance of the apparatus.

As discussed, the pass voltage Vpass is ramped according to the default pass voltage ramp rate lookup table and the shifted pass voltage ramp rate lookup table and based on the quantity of the plurality of planes associated with the plurality of memory cells being program-verified in the program operation during the pass voltage ramping time period of the program operation. Therefore, the apparatus further includes the default pass voltage ramping time period lookup table having a plurality of default pass voltage ramping times P13. In addition, the apparatus also includes the shifted pass voltage ramping time period lookup table having a plurality of pass voltage ramping time period offsets DP13_PB. FIGS. 19A and 19B show an example default pass voltage ramping time period lookup table and an example shifted pass voltage ramping time period lookup table. The control circuit is further configured to shift one of the plurality of default pass voltage ramping times P13 used in the program operation according to one of the plurality of pass voltage ramping time period offsets DP13_PB and based on the quantity of the plurality of planes associated with the plurality of memory cells being program-verified in the program operation.

Therefore, for example, if the plurality of planes includes a total of four planes, a program operation involving all four planes uses one of plurality of default pass voltage ramping times P13 when determining corresponding timing of the ramping of the read voltage (i.e., the pass voltage ramping time period). The one of plurality of plurality of default pass voltage ramping times P13 is chosen ahead of time to be used for the apparatus (e.g., determined during product development and used during production). Similarly, one of the plurality of pass voltage ramping time period offsets DP13_PB is chosen ahead of time to be used for the apparatus (e.g., determined during product development and used during production). If the program operation involves fewer than all of the four planes, the pass voltage ramping time period used is selected with reference to one of the plurality of pass voltage ramping time period offsets DP13_PB of the shifted pass voltage ramping time period lookup table. For example, the pass voltage ramping time period used for three planes is the one of plurality of default pass voltage ramping times P13 plus the one of the plurality of pass voltage ramping time period offsets DP13_PB (i.e., P13+DP13_PB for three planes). Similarly, if the program operation involves only two of the four planes, the pass voltage ramping time period used is the one of plurality of default pass voltage ramping times P13 plus two multiplied by the one of the plurality of pass voltage ramping time period offsets DP13_PB (i.e., P13+2*DP13_PB for two planes). In addition, if the program operation involves only one of the four planes, the pass voltage ramping time period used is the one of plurality of default pass voltage ramping times P13 plus two multiplied by the one of the plurality of pass voltage ramping time period offsets DP13_PB (i.e., P13+3*DP13_PB for one plane).

Accordingly, if the one of plurality of default pass voltage ramping times P13 for the apparatus is chosen to be T7 in the default pass voltage ramping time period lookup table for a program verify operation involving all four planes and the one of the pass voltage ramping time period offsets DP13_PB chosen for the apparatus is −1 DAC, a program operation involving only three of the four planes would use the T6 pass voltage ramping time. A program operation involving only two of the four planes would use the T5 pass voltage ramping time and a program operation involving only one of the four planes would use the T4 pass voltage ramping time.

Moreover, whenever the pass voltage ramping time period determined based on the default pass voltage ramping time period lookup table and the shifted pass voltage ramping time period lookup table exceeds a minimum one of the default pass voltage ramping times P13 (i.e., DAC), the control circuit is configured to use the minimum one of the plurality of default pass voltage ramping times P13 (e.g., the T1 default pass voltage ramping time P13).

Similarly, as discussed, the read voltage Vread is ramped according to the default read voltage ramp rate lookup table and the shifted read voltage ramp rate lookup table during the read voltage ramping time period of the program operation. Thus, the apparatus further includes the default read voltage ramping time period lookup table having a plurality of default read voltage ramping times R2_PVFY. The apparatus also includes the shifted read voltage ramping time period lookup table having a plurality of read voltage ramping time period offsets DR2_PVFY. FIGS. 20A and 20B show an example default read voltage ramping time period lookup table and an example shifted read voltage ramping time period lookup table. The control circuit is further configured to shift one of the plurality of default read voltage ramping times R2_PVFY used in the program operation according to one of the plurality of read voltage ramping time period offsets DR2_PVFY and based on the quantity of the plurality of planes associated with the plurality of memory cells being program-verified in the program operation.

Hence, for example, if the plurality of planes includes a total of four planes, a program operation involving all four planes uses one of plurality of default read voltage ramping times R2_PVFY when determining corresponding timing of the ramping of the read voltage Vread (i.e., the pass voltage ramping time period). The one of plurality of plurality of default read voltage ramping times R2_PVFY is chosen ahead of time to be used for the apparatus (e.g., determined during product development and used during production). Similarly, one of the plurality of read voltage ramping time period offsets DR2_PVFY is chosen ahead of time to be used for the apparatus (e.g., determined during product development and used during production). If the program operation involves fewer than all of the four planes, the read voltage ramping time period used is selected with reference to one of the plurality of read voltage ramping time period offsets DR2_PVFY of the shifted read voltage ramping time period lookup table. For example, the read voltage ramping time period used for three planes is the one of plurality of default read voltage ramping times R2_PVFY plus the one of the plurality of read voltage ramping time period offsets DR2_PVFY (i.e., R2_PVFY+DR2_PVFY for three planes). Similarly, if the program operation involves only two of the four planes, the read voltage ramping time period used is the one of plurality of default read voltage ramping times R2_PVFY plus two multiplied by the one of the plurality of read voltage ramping time period offsets DR2_PVFY (i.e., R2_PVFY+2*DR2_PVFY for two planes). In addition, if the program operation involves only one of the four planes, the read voltage ramping time period used is the one of plurality of default read voltage ramping times R2_PVFY plus two multiplied by the one of the plurality of read voltage ramping time period offsets DR2_PVFY (i.e., R2_PVFY+3*DR2_PVFY for one plane).

Accordingly, if the one of plurality of default read voltage ramping times R2_PVFY for the apparatus is chosen to be T22 in the default pass voltage ramping time period lookup table for a program verify operation involving all four planes and the one of the pass voltage ramping time period offsets DR2_PVFY chosen for the apparatus is −1 DAC, a program operation involving only three of the four planes would use the T21 pass voltage ramping time. A program operation involving only two of the four planes would use the T20 pass voltage ramping time and a program operation involving only one of the four planes would use the T19 pass voltage ramping time.

In addition, whenever the read voltage ramping time period determined based on the default read voltage ramping time period lookup table and the shifted read voltage ramping time period lookup table exceeds a minimum one of the default read voltage ramping times R2_PVFY (i.e., DAC), the control circuit is configured to use the minimum one of the plurality of default read voltage ramping times R2_PVFY (e.g., the T17 default pass voltage ramping time R2_PVFY).

Figure 21:
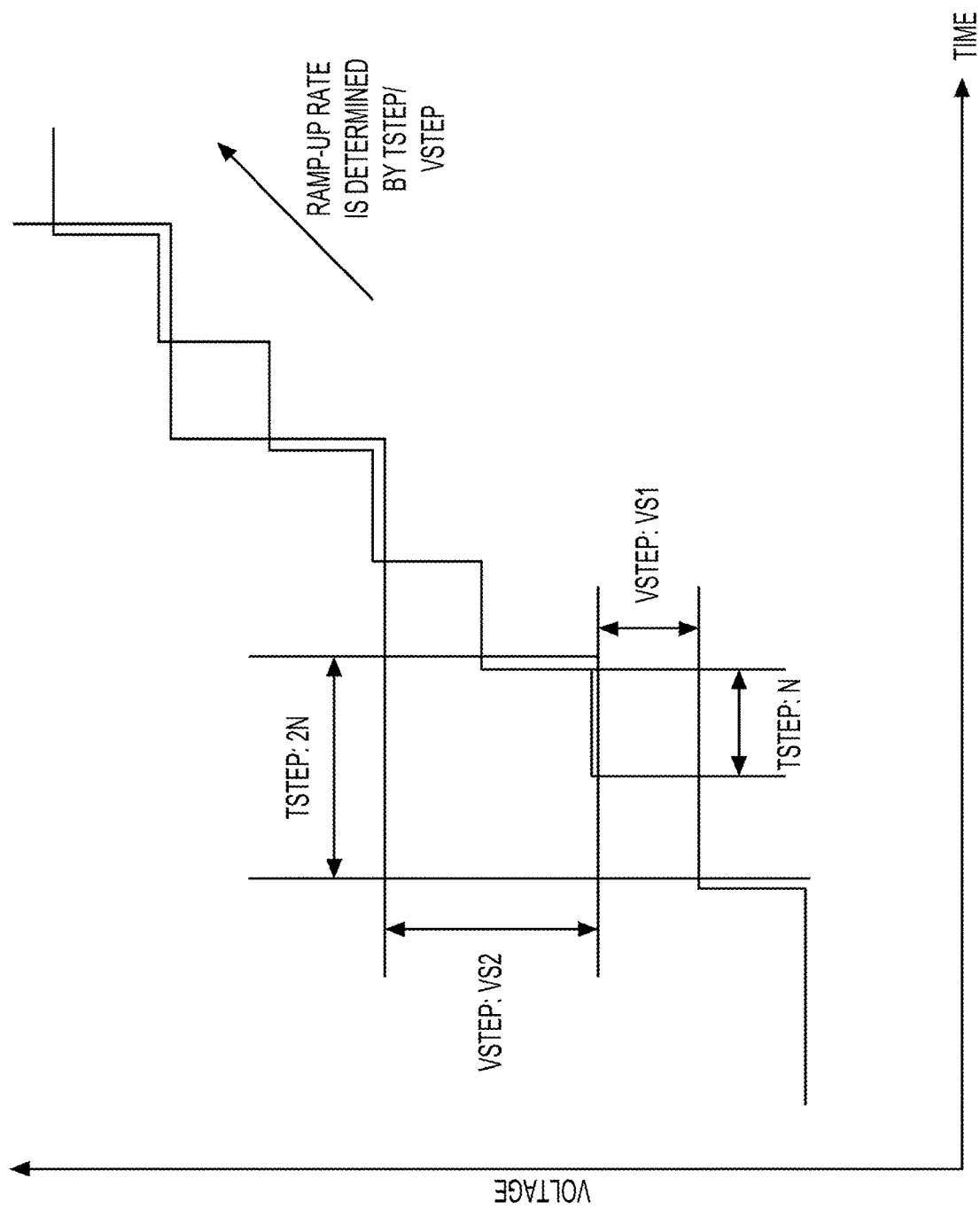
FIG. 21 illustrates how the pass voltage or read voltage ramp rate is determined with reference to a plot of a voltage versus time according to aspects of the disclosure.

FIG. 21 illustrates how the ramp rate is determined with reference to a plot of a voltage (e.g., pass voltage or read voltage) versus time. Voltage steps VS1 and VS2 are shown, with VS1 being smaller than VS2. According to an aspect, the ramp rate can be determined by dividing one of a plurality of time steps of an overall time period (e.g., the pass voltage ramping time period or the read voltage ramping time period) divided by one of a plurality of voltage steps VS1, VS2 of a total change in the voltage (e.g., the pass voltage or the read voltage).

Referring back to FIGS. 14A and 14B, the emulation result shown indicate that because the ramping parameter IBLRR_P (inhibit bit line ramping) determines the peak current over the program operation, the word line ramping for fewer planes (one plane in the emulation) can all be disabled, indicating no ramp rate control for the word lines, but still not exceeding the peak current compared to operation with both planes. Thus, while the word line ramp rate of the at least one word line voltage (e.g., Vpass or Vread) applied to the word lines during the program operation has been discussed above as being adjusted when the plurality of memory cells do not span all of the plurality of planes, the word line ramp rate of the at least one word line voltage may instead not be adjusted based on the number of planes involved. So, according to an aspect, the control circuit is further configured to not adjust (i.e., disable) the word line ramp rate control of the at least one word line voltage applied to the word lines during the program operation of the plurality of memory cells in response to the program operation of the plurality of memory cells not involving all of the plurality of planes. Nevertheless, it should be understood that for an apparatus with many word lines (e.g., 162 word lines), the component of peak current due to word lines is expected to change (increase).

Figure 22:
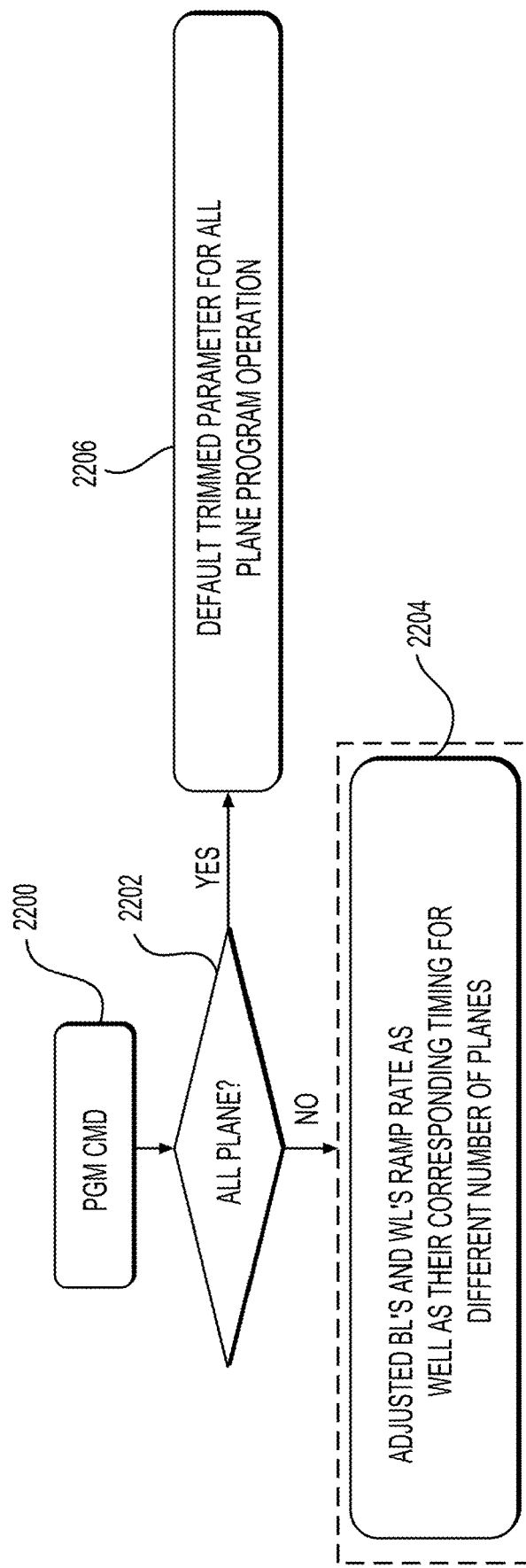
FIG. 22 illustrates steps of a method of operating a memory apparatus according to aspects of the disclosure.

Referring now to FIG. 22, a method of operating a memory apparatus (e.g., memory system 100 of FIGS. 1A-2B) is also provided. As above, the memory apparatus includes a plurality of memory cells (e.g., memory cell 142 of FIG. 2B, floating gate transistor 300 of FIG. 3, FGTs 604 of FIG. 6) connected to word lines (e.g., $WL_0$ to $WL_{M-1}$ of FIG. 6) and bit lines (e.g., $BL_0$ to $BL_{P-1}$ of FIG. 6) and arranged in a plurality of planes (e.g., plane 0, plane 1 of FIG. 5B). The method includes the step of 2200 receiving a program command to start the program operation. The next step of the method is 2202 determining whether a program operation of the plurality of memory cells involves all of the plurality of planes. The method proceeds by 2204 adjusting at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation in response to the program operation of the plurality of memory cells not involving all of the plurality of planes. The method also includes the step of 2206 applying the bit line voltage to the bit lines with a predetermined default trimmed bit line ramp rate and applying the at least one word line voltage to the word lines with a predetermined default trimmed word line ramp rate during the program operation of the plurality of memory cells in response to the program operation of the plurality of memory cells involving all of the plurality of planes.

As discussed above, the memory apparatus further includes the default bit line voltage ramp rate lookup table having the plurality of default bit line voltage ramp rates IBLRR_P of the bit line voltage. The memory apparatus also includes the shifted bit line voltage ramp rate lookup table having the plurality of bit line shift offsets DIBLRR_P_PB. Thus, the method further includes the step of referencing the default bit line voltage ramp rate lookup table and the shifted bit line voltage ramp rate lookup table and determining which of the plurality of default bit line voltage ramp rates IBLRR_P is used in the program operation according to one of the plurality of bit line shift offsets DIBLRR_P_PB selected and based on the quantity of the plurality of planes associated with the plurality of memory cells being program-verified in the program operation.

Accordingly, the bit line voltage is ramped according to the default bit line voltage ramp rate lookup table and the shifted bit line voltage ramp rate lookup table and based on the quantity of the plurality of planes associated with the plurality of memory cells being program-verified in the program operation during a bit line voltage ramping time period of the program operation. So, the method further includes the step of automatically determining the bit line voltage ramping time period used in the program operation based on the ramping of the bit line voltage according to the default bit line voltage ramp rate lookup table and the shifted bit line voltage ramp rate lookup table and based on the quantity of the plurality of planes associated with the plurality of memory cells being program-verified in the program operation.

As previously discussed, the at least one word line voltage includes a pass voltage Vpass applied to the plurality of selected and unselected word lines during a programming portion of the program operation. So, the memory apparatus further includes a default pass voltage ramp rate lookup table having a plurality of default pass voltage ramp rates RRC_VPASS and a shifted pass voltage ramp rate lookup table having a plurality of pass voltage shift offsets DRRC_VPASS_PB. Therefore, the method further includes the step of shifting one of the plurality of default pass voltage ramp rates RRC_VPASS used in the program operation according to one of the plurality of pass voltage shift offsets DRRC_VPASS_PB and based on the quantity of the plurality of planes associated with the plurality of memory cells being program-verified in the program operation.

In addition, as discussed, the memory apparatus further includes a default pass voltage ramping time period lookup table having a plurality of default pass voltage ramping times P13. The memory apparatus also includes a shifted pass voltage ramping time period lookup table having a plurality of pass voltage ramping time period offsets DP13_PB. Thus, the method further includes the step of shifting one of the plurality of default pass voltage ramping times P13 used in the program operation according to one of the plurality of pass voltage ramping time period offsets DP13_PB and based on the quantity of the plurality of planes associated with the plurality of memory cells being program-verified in the program operation.

As above, the at least one word line voltage includes a read voltage Vread applied to the plurality of selected and unselected word lines during a verify portion of the program operation (i.e., the program verify). So, the memory apparatus further includes a default read voltage ramp rate lookup table having a plurality of default read voltage ramp rates RRC_VREAD_PVFY. The memory apparatus also includes a shifted read voltage ramp rate lookup table having a plurality of read voltage shift offsets DRRC_VREAD_PVFY_PB. The method further includes the step of shifting one of the plurality of default read voltage ramp rates RRC_VREAD_PVFY used in the program operation according to one of the plurality of read voltage shift offsets DRRC_VREAD_PVFY_PB and based on the quantity of the plurality of planes associated with the plurality of memory cells being program-verified in the program operation.

Additionally, as discussed the memory apparatus further includes the default read voltage ramping time period lookup table having the plurality of default read voltage ramping times R2_PVFY. The memory apparatus also includes a shifted read voltage ramping time period lookup table having a plurality of read voltage ramping time period offsets DR2_PVFY. Thus, the method further includes the step of shifting one of the plurality of default read voltage ramping times R2_PVFY used in the program operation according to one of the plurality of read voltage ramping time period offsets DR2_PVFY and based on the quantity of the plurality of planes associated with the plurality of memory cells being program-verified in the program operation.

Though the word line ramp rate of the at least one word line voltage applied to the word lines during the program operation has been discussed above as being adjusted when the plurality of memory cells do not span all of the plurality of planes, the word line ramp rate of the at least one word line voltage may instead not be adjusted based on the number of planes involved. So, according to an aspect, the method further includes the step of not adjusting the word line ramp rate of the at least one word line voltage applied to the word lines during the program operation of the plurality of memory cells in response to the program operation of the plurality of memory cells not involving all of the plurality of planes.

While adjustments to ramp rates and corresponding time periods is primarily discussed herein with reference to lookup tables, it should be appreciated that the apparatus and method disclosed could instead utilize alternative techniques to carry out the adjustment. For instance, one or more additional formulas or algorithms could be stored in ROM and used to determine when and how much to adjust the ramp rates and corresponding time periods based on the quantity of planes involved.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
   a plurality of memory cells connected to word lines and bit lines and arranged in a plurality of planes; and
   a control circuit coupled to the word lines and the bit lines and configured to:
      determine whether a program operation of the plurality of memory cells involves all of the plurality of planes, and
      in response to the program operation of the plurality of memory cells not involving all of the plurality of planes, adjust at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation.

2. The apparatus as set forth in claim 1 further including:
   a default bit line voltage ramp rate lookup table having a plurality of default bit line voltage ramp rates of the bit line voltage, and
   a shifted bit line voltage ramp rate lookup table having a plurality of bit line shift offsets;
   and wherein the control circuit is further configured to reference the default bit line voltage ramp rate lookup table and the shifted bit line voltage ramp rate lookup table and determine which of the plurality of default bit line voltage ramp rates is used in the program operation according to one of the plurality of bit line shift offsets and based on the quantity of the plurality of planes associated with the plurality of memory cells being program-verified in the program operation.

3. The apparatus as set forth in claim 2, wherein the bit line voltage is ramped according to the default bit line voltage ramp rate lookup table and the shifted bit line voltage ramp rate lookup table and based on the quantity of the plurality of planes associated with the plurality of memory cells being program-verified in the program operation during a bit line voltage ramping time period of the program operation and the control circuit is further configured to automatically determine the bit line voltage ramping time period used in the program operation based on the ramping of the bit line voltage according to the default bit line voltage ramp rate lookup table and the shifted bit line voltage ramp rate lookup table and based on the quantity of the plurality of planes associated with the plurality of memory cells being program-verified in the program operation.

4. The apparatus as set forth in claim 1, wherein the word lines include a selected word line being program-verified at a time and a plurality of unselected word lines not being program-verified at the time during the program operation and the at least one word line voltage includes a pass voltage applied to the plurality of selected word lines and the plurality of unselected word lines during a programming portion of the program operation, the apparatus further including:
   a default pass voltage ramp rate lookup table having a plurality of default pass voltage ramp rates,
   a shifted pass voltage ramp rate lookup table having a plurality of pass voltage shift offsets,
   and wherein the control circuit is further configured to shift one of the plurality of default pass voltage ramp rates used in the program operation according to one of the plurality of pass voltage shift offsets and based on the quantity of the plurality of planes associated with the plurality of memory cells being program-verified in the program operation.

5. The apparatus as set forth in claim 4, wherein the pass voltage is ramped according to the default pass voltage ramp rate lookup table and the shifted pass voltage ramp rate lookup table and based on the quantity of the plurality of planes associated with the plurality of memory cells being program-verified in the program operation during a pass voltage ramping time period of the program operation and the apparatus further includes:
   a default pass voltage ramping time period lookup table having a plurality of default pass voltage ramping times,
   a shifted pass voltage ramping time period lookup table having a plurality of pass voltage ramping time period offsets;
   and wherein the control circuit is further configured to shift one of the plurality of default pass voltage ramping times used in the program operation according to one of the plurality of pass voltage ramping time period offsets and based on the quantity of the plurality of planes associated with the plurality of memory cells being program-verified in the program operation.

6. The apparatus as set forth in claim 1, wherein the word lines include a selected word line being program-verified at a time and a plurality of unselected word lines not being program-verified at the time during the program operation and the at least one word line voltage includes a read voltage applied to the plurality of selected word lines and the plurality of unselected word lines during a verify portion of the program operation, the apparatus further including:
   a default read voltage ramp rate lookup table having a plurality of default read voltage ramp rates, and a shifted read voltage ramp rate lookup table having a plurality of read voltage shift offsets;

and wherein the control circuit is further configured to shift one of the plurality of default read voltage ramp rates used in the program operation according to one of the plurality of read voltage shift offsets and based on the quantity of the plurality of planes associated with the plurality of memory cells being program-verified in the program operation.

7. The apparatus as set forth in claim 6, wherein the read voltage is ramped according to the default read voltage ramp rate lookup table and the shifted read voltage ramp rate lookup table during a read voltage ramping time period of the program operation and the apparatus further includes:

a default read voltage ramping time period lookup table having a plurality of default read voltage ramping times, a shifted read voltage ramping time period lookup table having a plurality of read voltage ramping time period offsets;

and wherein the control circuit is further configured to shift one of the plurality of default read voltage ramping times used in the program operation according to one of the plurality of read voltage ramping time period offsets and based on the quantity of the plurality of planes associated with the plurality of memory cells being program-verified in the program operation.

8. The apparatus as set forth in claim 1, wherein the control circuit is further configured to not adjust the word line ramp rate of the at least one word line voltage applied to the word lines during the program operation of the plurality of memory cells in response to the program operation of the plurality of memory cells not involving all of the plurality of planes.

9. A controller in communication with a memory apparatus including a plurality of memory cells connected to word lines and bit lines and arranged in a plurality of planes, the controller configured to:

determine whether a program operation of the plurality of memory cells involves all of the plurality of planes; and in response to the program operation of the plurality of memory cells not involving all of the plurality of planes, instruct the memory apparatus to adjust at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation.

10. The controller as set forth in claim 9, further including:

a default bit line voltage ramp rate lookup table having a plurality of default bit line voltage ramp rates of the bit line voltage, and a shifted bit line voltage ramp rate lookup table having a plurality of bit line shift offsets;

and wherein the controller is further configured to reference the default bit line voltage ramp rate lookup table and the shifted bit line voltage ramp rate lookup table and determine which of the plurality of default bit line voltage ramp rates is used in the program operation according to one of the plurality of bit line shift offsets selected and based on the quantity of the plurality of planes associated with the plurality of memory cells being program-verified in the program operation.

11. The controller as set forth in claim 9, wherein the word lines include a selected word line being program-verified at a time and a plurality of unselected word lines not being program-verified at the time during the program operation and the at least one word line voltage includes a pass voltage applied to the plurality of selected word lines and the plurality of unselected word lines during a programming portion of the program operation, the controller further including:

a default pass voltage ramp rate lookup table having a plurality of default pass voltage ramp rates, a shifted pass voltage ramp rate lookup table having a plurality of pass voltage shift offsets, and wherein the controller is further configured to shift one of the plurality of default pass voltage ramp rates used in the program operation according to one of the plurality of pass voltage shift offsets and based on the quantity of the plurality of planes associated with the plurality of memory cells being program-verified in the program operation.

12. The controller as set forth in claim 9, wherein the word lines include a selected word line being program-verified at a time and a plurality of unselected word lines not being program-verified at the time during the program operation and the at least one word line voltage includes a read voltage applied to the plurality of selected word lines and the plurality of unselected word lines during a verify portion of the program operation, the controller further including:

a default read voltage ramp rate lookup table having a plurality of default read voltage ramp rates, and a shifted read voltage ramp rate lookup table having a plurality of read voltage shift offsets;

and wherein the controller is further configured to shift one of the plurality of default read voltage ramp rates used in the program operation according to one of the plurality of read voltage shift offsets and based on the quantity of the plurality of planes associated with the plurality of memory cells being program-verified in the program operation.

13. A method of operating a memory apparatus including a plurality of memory cells connected to word lines and bit lines and arranged in a plurality of planes, the method comprising the steps of:

determining whether a program operation of the plurality of memory cells involves all of the plurality of planes; and adjusting at least one of a bit line ramp rate of a bit line voltage applied to the bit lines and a word line ramp rate of at least one word line voltage applied to the word lines during the program operation of the plurality of memory cells based on a quantity of the plurality of planes associated with the plurality of memory cells being program-verified in the program operation in response to the program operation of the plurality of memory cells not involving all of the plurality of planes.

14. The method as set forth in claim 13, wherein the memory apparatus further includes a default bit line voltage ramp rate lookup table having a plurality of default bit line voltage ramp rates of the bit line voltage, and a shifted bit line voltage ramp rate lookup table having a plurality of bit line shift offsets and the method further includes the step of referencing the default bit line voltage ramp rate lookup table and the shifted bit line voltage ramp rate lookup table and determining which of the plurality of default bit line voltage ramp rates is used in the program operation according to one of the plurality of bit line shift offsets and based on the quantity of the plurality of planes associated with the plurality of memory cells being program-verified in the program operation.

15. The method as set forth in claim 14, wherein the bit line voltage is ramped according to the default bit line voltage ramp rate lookup table and the shifted bit line voltage ramp rate lookup table and based on the quantity of the plurality of planes associated with the plurality of memory cells being program-verified in the program operation during a bit line voltage ramping time period of the program operation and the method further includes the step of automatically determining the bit line voltage ramping time period used in the program operation based on the ramping of the bit line voltage according to the default bit line voltage ramp rate lookup table and the shifted bit line voltage ramp rate lookup table and based on the quantity of the plurality of planes associated with the plurality of memory cells being program-verified in the program operation.

16. The method as set forth in claim 13, wherein the word lines include a selected word line being program-verified at a time and a plurality of unselected word lines not being program-verified at the time during the program operation and the at least one word line voltage includes a pass voltage applied to the plurality of selected word lines and the plurality of unselected word lines during a programming portion of the program operation, the memory apparatus further includes a default pass voltage ramp rate lookup table having a plurality of default pass voltage ramp rates and a shifted pass voltage ramp rate lookup table having a plurality of pass voltage shift offsets, the method further includes the step of shifting one of the plurality of default pass voltage ramp rates used in the program operation according to one of the plurality of pass voltage shift offsets and based on the quantity of the plurality of planes associated with the plurality of memory cells being program-verified in the program operation.

17. The method as set forth in claim 16, wherein the pass voltage is ramped according to the default pass voltage ramp rate lookup table and the shifted pass voltage ramp rate lookup table and based on the quantity of the plurality of planes associated with the plurality of memory cells being program-verified in the program operation during a pass voltage ramping time period of the program operation and the memory apparatus further includes a default pass voltage ramping time period lookup table having a plurality of default pass voltage ramping times and a shifted pass voltage ramping time period lookup table having a plurality of pass voltage ramping time period offsets, the method further includes the step of shifting one of the plurality of default pass voltage ramping times used in the program operation according to one of the plurality of pass voltage ramping time period offsets and based on the quantity of the plurality of planes associated with the plurality of memory cells being program-verified in the program operation.

18. The method as set forth in claim 13, wherein the word lines include a selected word line being program-verified at a time and a plurality of unselected word lines not being program-verified at the time during the program operation and the at least one word line voltage includes a read voltage applied to the plurality of selected word lines and the plurality of unselected word lines during a verify portion of the program operation and the memory apparatus further includes a default read voltage ramp rate lookup table having a plurality of default read voltage ramp rates, and a shifted read voltage ramp rate lookup table having a plurality of read voltage shift offsets, the method further includes the step of shifting one of the plurality of default read voltage ramp rates used in the program operation according to one of the plurality of read voltage shift offsets and based on the quantity of the plurality of planes associated with the plurality of memory cells being program-verified in the program operation.

19. The method as set forth in claim 18, wherein the read voltage is ramped according to the default read voltage ramp rate lookup table and the shifted read voltage ramp rate lookup table during a read voltage ramping time period of the program operation and the memory apparatus further includes a default read voltage ramping time period lookup table having a plurality of default read voltage ramping times and a shifted read voltage ramping time period lookup table having a plurality of read voltage ramping time period offsets, the method further includes the step of shifting one of the plurality of default read voltage ramping times used in the program operation according to one of the plurality of read voltage ramping time period offsets and based on the quantity of the plurality of planes associated with the plurality of memory cells being program-verified in the program operation.

20. The method as set forth in claim 13, further including the step of not adjusting the word line ramp rate of the at least one word line voltage applied to the word lines during the program operation of the plurality of memory cells in response to the program operation of the plurality of memory cells not involving all of the plurality of planes.

* * * * *